United States Patent [19]
Itoh et al.

[11] Patent Number: 6,107,658
[45] Date of Patent: Aug. 22, 2000

[54] NON-VOLATILE SEMICONDUCTOR MEMORY DEVICE

[75] Inventors: Yasuo Itoh, Kawasaki; Koji Sakui, Tokyo, both of Japan

[73] Assignee: Kabushiki Kaisha Toshiba, Kawasaki, Japan

[21] Appl. No.: 09/468,928

[22] Filed: Dec. 22, 1999

Related U.S. Application Data

[63] Continuation of application No. 09/031,681, Feb. 27, 1998, Pat. No. 6,011,287.

[30] Foreign Application Priority Data

Feb. 27, 1997 [JP] Japan ................................. 9-044007

[51] Int. Cl.[7] .................................................... H01L 29/72
[52] U.S. Cl. .......................... 257/315; 257/316; 257/317; 365/185.17; 365/185.28
[58] Field of Search ..................................... 257/315, 316, 257/317; 365/185.17, 185.28

[56] References Cited

U.S. PATENT DOCUMENTS

5,508,957  4/1996  Momodomi et al. .................... 257/315

*Primary Examiner*—Edward Wojciechowicz
*Attorney, Agent, or Firm*—Banner & Witcoff, Ltd.

[57] ABSTRACT

In a NAND EEPROM using the local self-boosting system, an intermediate voltage which allows a memory cell adjacent to a selected memory cell to be turned on is applied to the control gate of the adjacent memory cell. As a result, even if the adjacent memory cell is in a normally-off state, the potential of a bit line can be transmitted to the adjacent memory cell. Thus, the reliability of the write inhibition in a non-selected NAND memory cell column is improved, while data can be written at random into a plurality of memory cells in a selected NAND memory cell column. When data is to be erased, an absolute value of an erasing voltage applied to a control gate can be less. As a result, data can be erased by a lower erasure voltage than that required in the conventional art. Consequently, the element refinement, the reliability and the yield can be further improved.

21 Claims, 15 Drawing Sheets

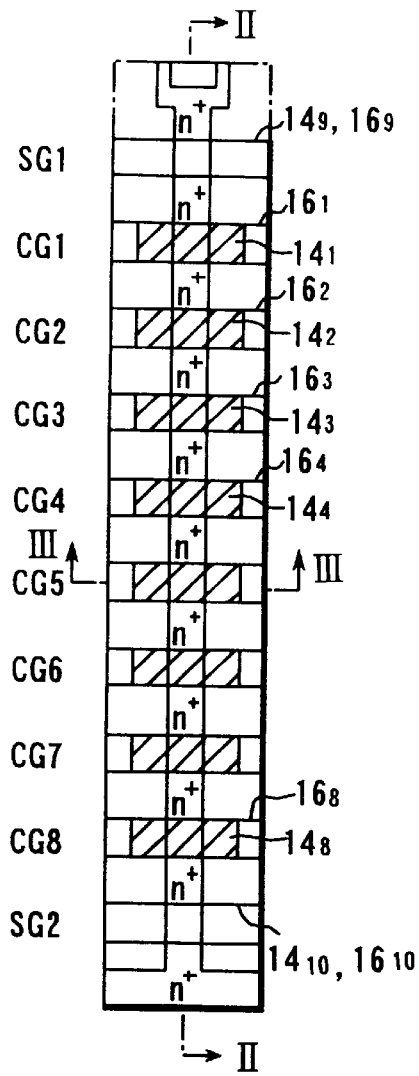
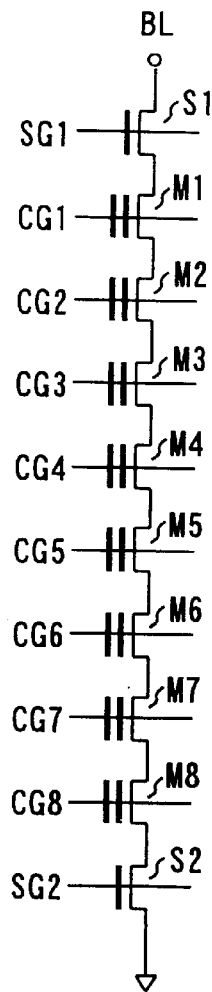
FIG. 1A (PRIOR ART)
FIG. 1B (PRIOR ART)
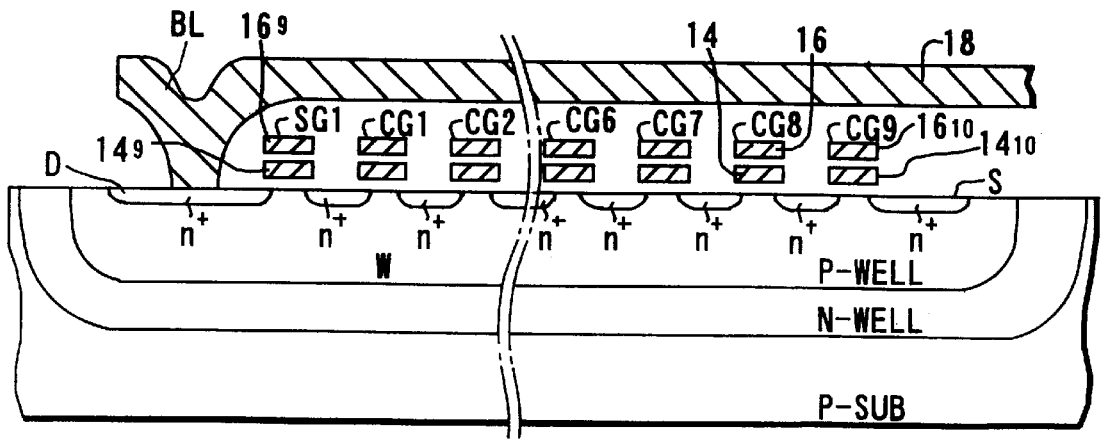
FIG. 2 (PRIOR ART)

| | READ | ERASE | WRITE |
|---|---|---|---|
| BL | 1V PRECHARGE | OPEN | WRITE '0'  0V<br>WRITE '1'  3.3V |
| SG1 | 4.5V | 0V | 3.3V |
| CG | SELECTED  0V<br>NON-SELECTED  4.5V | 0V | SELECTED  18V<br>NON-SELECTED  9V |
| SG2 | 4.5V | 0V | 0V |
| W | 0V | 20V | 0V |
| S | 0V | OPEN | 0V |

| | UNIT:VOLT EXCEPT FOR tc | | | | | | | |
|---|---|---|---|---|---|---|---|---|
| Vdcp | 3.5V | | 4.5V | | 6.0V | | 8.0V | |
| Vth | +1V | -1V | +1V | -1V | +1V | -1V | +1V | -1V |
| tc | 0.34 | 0.38 | 0.45 | 0.50 | 0.63 | 0.68 | 0.87 | 0.92 |
| Vch(tc) | 2.50 | 4.50 | 3.47 | 5.50 | 5.00 | 7.00 | 7.00 | 9.20 |
| Vchn | 7.81 | 9.44 | 7.84 | 9.49 | 7.95 | 9.57 | 8.06 | 9.88 |
| Vchs | 12.06 | 15.61 | 11.33 | 12.68 | 10.31 | 11.63 | 8.90 | 10.42 |

NON-VOLATILE SEMICONDUCTOR MEMORY DEVICE

This is a continuation of Ser. No. 09/031,681 filed Feb. 27, 1998 now U.S. Pat. No. 6,011,287.

BACKGROUND OF THE INVENTION

The present invention relates generally to an electrically erasable programmable non-volatile semiconductor memory device, in which a memory, comprising an electricity-charging floating gate electrode and a control gate electrode stacked thereon, is used as a memory cell, and more particularly to a NAND EEPROM (electrically erasable programmable ROM) in which a plurality of memory cells are connected in series.

FIG. 1A is a plan view showing one memory cell column of a conventional NAND EEPROM, and FIG. 1B is a diagram showing an equivalent circuit of the memory cell column shown in FIG. 1. FIG. 2 is a cross-sectional view of the memory cell column shown in FIG. 1A, taken along the line II—II. FIG. 3 is a cross-sectional view of the memory cell column shown in FIG. 1A, taken along the line III—III.

The memory cell column is formed in a double-diffusion type p-well 11 formed in a p-type semiconductor substrate. Each of the memory cells of the column has an electricity-charging floating gate electrode 14 and a control gate electrode 16. In the following description, the memory cell may be called simply a cell. As shown in the drawings, the memory cell column is constituted by a plurality of stacked-type memory cells M1 to M8 connected in series and controlled by control gates CG1 to CG8. Selection transistors S1 and S2 are respectively provided on both ends of the serially-connected memory cell column, i.e., on both a drain D side and a source S side. Selection gates SG1 and SG2 of the selection transistors S1 and S2 control the connection or disconnection between a bit line 18 of the memory cell column on one hand and a common source line on the other. In FIG. 3, a reference numeral 17 denotes an interlayer insulating film. In FIG. 2, elements $14_9$ and $14_{10}$ are electrically connected to each other, and elements $16_9$ and $16_{10}$ are electrically connected to each other in a region (not shown) to form the selection gate SG1 and SG2, respectively.

FIG. 4 shows voltages applied to the respective portions in erasing, writing and reading operations in the memory cell described above. The operations and problems thereof will be described below.

<Data Erasing>

To erase data, a bit line BL and a source S are opened, the control gate CG and selection gates SG1 and SG2 are all biased to 0 V and an erasure voltage $V_{EE}$ (e.g., 20 V) is applied to the substrate W (p-well layer) 11. As a result, the tunneling of an oxide film is effected. Utilizing the tunneling effect, electrons in all the floating gate electrodes are extracted. Consequently, the threshold voltages of all the memory cells are 0 V or lower, resulting in that the memory cells are in a normally-on state (depletion type). In this description, the normally-on state is defined as data "1". On the other hand, a normally-off state (enhancement type) is defined as data "0".

When data is collectively erased in the conventional NAND EEPROM, it is necessary to apply a high erasure voltage ($V_{EE}$) of about 20 V to the p-well layer. Therefore, the conventional NAND EEPROM must use a transistor of a high withstand voltage (in which, the thickness of the gate oxide film is as thick as 400 Å. In addition, as regards the design rule, the distance between lines must be greater as compared to the circuit for a lower voltage. For these reasons, element refinement and high-density integration of elements have been prevented.

Further, since a high voltage is used, it is difficult to design a reliable element.

<Data Writing and Erasing>

In data writing, a writing voltage Vpp (e.g., 20 V) is applied to the control gate of a selected cell of the control gates CG. An intermediate voltage Vm (e.g., 10 V) between Vpp and 0 V is applied to the control gate of a non-selected cell. In this state, a potential of 0 V is applied to the bit line BL of the cell to which data "0" is to be written, while the potential of Vm is applied to the bit line BL of the cell in which data "1" is to be maintained.

In a selected memory cell (the potential of the control gate=Vpp=20 V, the potential of the bit line=0 V), the voltage (Vpp=20 V) applied between the control gate electrode 16 and the substrate 11 is divided in accordance with a ratio (hereinafter referred to as a coupling ratio) of a static capacitance (Cs1) between the floating gate electrode 14 and the semiconductor substrate to a static capacitance (Cs2) between the floating gate electrode 14 and the control gate electrode 16 (Cs2/(Cs1+Cs2)). For example, in the case of Cs2/(Cs1+Cs2)=0.5, the potential difference between the floating gate electrode 14 and the semiconductor substrate 11 is 10 V. In this case, assuming that the thickness of the tunnel oxide film is 10 nm, the field of 10 MV/cm is applied to a gate oxide film (hereinafter referred to as a tunnel oxide film) between the floating gate electrode 14 and the semiconductor substrate 11. At this time, a Fowler-Nordheim current (hereinafter referred to as a tunnel current) flows through the tunnel oxide film, so that electrons are injected into the floating gate electrode 14. As a result, the threshold voltage of the selected memory cell becomes positive; that is, the normally-off state. In other words, data "0" is written into the selected cell. The threshold voltage of the selected cell should be set to a level between 0 V and Vcc (e.g., 5 V).

On the other hand, in a non-selected memory cell column wherein data "1" is maintained, although a certain field is applied to a memory cell, even when a high voltage (Vpp) is applied to the control gate electrode 16, the voltage applied between the substrate 11 and the control gate electrode 16 is smaller than that in the selected cell (Vpp−Vm= 20 V−10 V=10 V), since the voltage (Vm) from the bit line is applied to a channel. Thus, since the field applied to the tunnel oxide film is also mitigated (to about 5 MV/cm), no tunnel current flows and data "0" is not written into the non-selected cell.

In data reading, the bit line which is connected to the cell column including a selected cell is precharged to 1 V for example, while the other bit lines are set to 0 V. The voltage of 0 V is applied to the control gate of the selected cell, while a voltage of Vcc (=5 V) is applied to the control gates of all the non-selected cells. As a result, the selected cell is turned on or off depending on whether data "1" or "0" has been written therein. The non-selected cells are all in the ON state, whether data "1" or "0" has been written. Therefore, when the selection gates SG1 and SG2 are opened, if the selected cell has data "1", i.e., in the normally-on state (depleted), a current flows through the source. However, if the selected cell has data "0", i.e., in the normally-off state (enhanced), no current flows in the cell column. Thus, it is possible to determine whether the selected cell has data "0"

or "1", depending on whether a current flows through the selected cell column from the bit line. FIG. 5 shows characteristics of a cell having a threshold voltage Vth higher than 0 V (i.e., enhanced cell) and a cell having a threshold voltage Vth lower than 0 V (depleted cell). In FIG. 5, $V_{CG}$ denotes a voltage applied to the control gate and Id denotes a drain current.

The data writing as described above is called a fixed-potential writing system. An improvement of the system is a self-boosting system published by K. D. Suh et al. in IEEE Journal of Solid-State Circuits, vol. 30, No. 11 (1995). In the self-boosting system, the write inhibit mechanism in a non-selected NAND cell column is improved, so that the potential amplitude between a selected bit line and a non-selected bit line is reduced to 0 V→Vcc (e.g., 3.3 V) from 0 V→$V_M$(e.g., 10 V) in the conventional system. As a result, the withstand voltages of various transistors in the memory device can be lowered, thereby achieving element refinement.

Further, T. S. Jung et al. improved the self-boosting system of K. D. Suh et al. and devised a local self-boosting system (LBS), in which a cell is selectively self-boosted and data is written therein (T. S. Jung et al. ISSCC Tech-Dig., P32, 1996). According to the local self-boosting system, the stress due to a write voltage Vpgm in a non-selected NAND cell column can be reduced, so that the variance of the threshold voltages of multileveled cells in particular can be considerably reduced.

However, the local self-boosting system is disadvantageous in that the write inhibition in a non-selected NAND cell column does not have sufficient reliability, and data cannot be written at random in a plurality of cells in a selected NAND cell column.

BRIEF SUMMARY OF THE INVENTION

Accordingly, an object of the present invention is to provide a non-volatile semiconductor memory device having a NAND EEPROM to which the local self-boosting system is applied, in which the reliability of the write inhibition in a non-selected NAND cell column is improved and data can be written at random in a plurality of memory cells in a selected NAND cell column.

Another object of the present invention is to provide a non-volatile semiconductor memory device, in which data can be erased from a NAND EEPROM by means of an erasure voltage lower than that in the conventional art and the element refinement, the reliability and the yield can be improved.

According to one aspect of the present invention, there is provided a non-volatile semiconductor memory device comprising: a plurality of NAND memory cell columns, each comprising a plurality of electrically erasable programmable memory cells connected in series; a first selection gate transistor connected to an end on a bit line side of the plurality of electrically erasable programmable memory cells; and a second selection gate transistor connected to the other end on a source line side of the plurality of electrically erasable programmable memory cells, wherein: when data is to be written into a selected memory cell in a selected NAND memory cell column, a low voltage is applied from a bit line to the selected NAND memory cell column, while a high voltage is applied from another bit line to a non-selected NAND memory cell column which shares control gate electrodes with the selected NAND memory cell column, and a channel region of the non-selected NAND memory cell column is caused to be floating, a first voltage, having a potential which is different sufficiently for data writing from a potential of a channel region of the selected NAND memory cell column, is applied to a control gate electrode of the selected memory cell, and a second voltage is applied to a control gate electrode of at least one of adjacent memory cells on both sides of the selected memory cell, the second voltage being sufficient to turn on the at least one of the adjacent memory cells in case of being normally off, and to allow local self-boosting of a channel potential of a memory cell in the non-selected NAND memory cell column which shares the control gate electrode with the selected memory cell.

According to another aspect of the present invention, there is provided a non-volatile semiconductor memory device comprising: a plurality of NAND memory cell columns, each comprising a plurality of electrically erasable programmable memory cells connected in series; a first selection gate transistor connected to an end on a bit line side of the plurality of electrically erasable programmable memory cells; and a second selection gate transistor connected to the other end on a source line side of the plurality of electrically erasable programmable memory cells, wherein: when data is to be written into a selected memory cell in a selected NAND memory cell column, a bit line potential is transmitted from a bit line to channel regions of the selected memory cell in the selected NAND memory cell column and a memory cell which shares a control gate electrode with the selected memory cell in a non-selected NAND memory cell column which shares control gate electrodes with the selected NAND memory cell column, and the channel region of the non-selected NAND memory cell column is caused to be floating, potentials of control gate electrodes of the selected NAND memory cell column are risen to predetermined levels and a potential of the channel region of the non-selected NAND memory cell column is self-boosted by capacitive coupling, a memory cell in the non-selected NAND memory cell column, which shares a control gate electrode with a memory cell adjacent to the selected memory cell, is turned off by utilizing a difference between the self-boosted potential of the channel region and a potential of the control gate electrode of the memory cell adjacent to the selected memory cell, and after the memory cell in the non-selected NAND memory cell column which shares the control gate electrode with the memory cell adjacent to the selected memory cell is turned off, a potential of the memory cell in the non-selected NAND memory cell column which shares the control gate electrode with the selected memory cell is boosted to a final potential.

According to another aspect of the present invention, there is provided a non-volatile semiconductor memory device comprising: a plurality of NAND memory cell columns, each comprising a plurality of electrically erasable programmable memory cells connected in series; a first selection gate transistor connected to an end on a bit line side of the plurality of electrically erasable programmable memory cells; and a second selection gate transistor connected to the other end on a source line side of the plurality of electrically erasable programmable memory cells, wherein when data is to be erased from a selected memory cell in a selected NAND memory cell column, at least a channel region of a memory cell between the selected memory cell and the second selection gate transistor is supplied with a first voltage from a bit line and caused to be floating, while a second voltage is applied to a control gate electrode of the selected memory cell and a third voltage is applied to control gate electrodes of non-selected memory cells in the selected NAND memory cell column, the second voltage having a first polarity and the first and third voltages having a second polarity opposite to the first polarity.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 1A and 1B are a plan view and an equivalent circuit diagram thereof, showing a memory cell column of a NAND EEPROM;

FIG. 2 is a cross-sectional view of the memory cell column shown in FIG. 1A, taken along the line II—II;

DETAILED DESCRIPTION OF THE INVENTION

The present invention will be described in detail with reference to the accompanying drawings.

Prior to describing embodiments of the present invention, the basic concept of the present invention will be explained, so that the present invention can be understood easily.

The present invention is obtained by improving the self-boosting system of K. D. Suh et al. and the local self-boosting system of T. S. Jung et al., which constitute part of the present invention. In order to understand the present invention, it is indispensable to understand the conventional systems. Therefore, the two self-boosting systems will be described first.

Figures 3, 4:
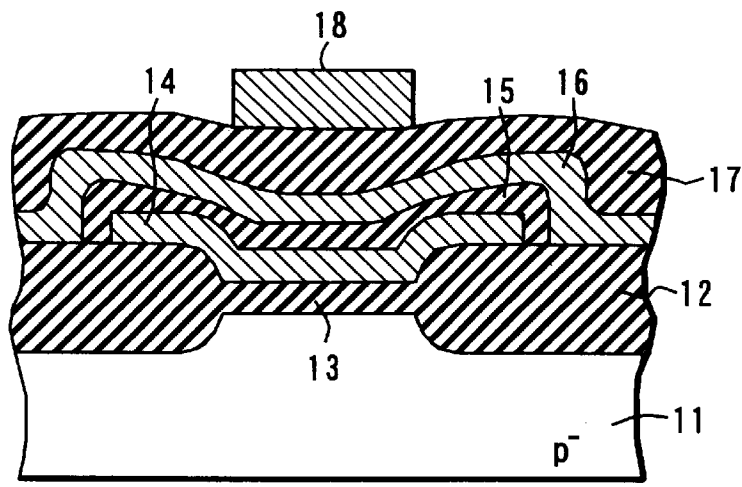
FIG. 3 is a cross-sectional view of the memory cell column shown in FIG. 1A, taken along the line III—III.
FIG. 4 is a diagram showing voltage control in erasing, writing and reading operations in a conventional NAND EEPROM.
Figure 5:
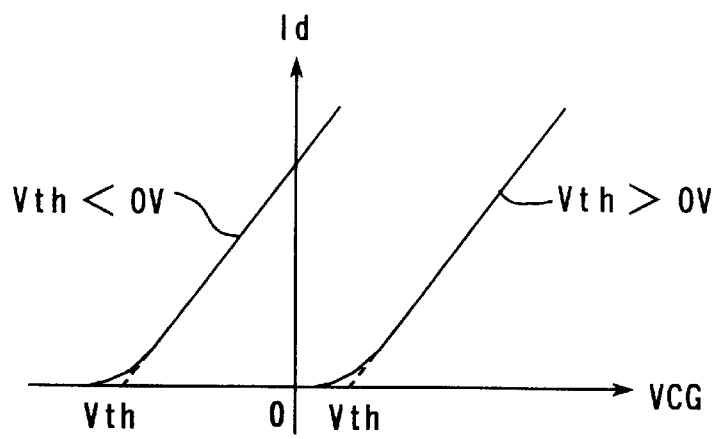
FIG. 5 is a diagram showing threshold voltages of a cell transistor when a memory cell stores data "1" and "0"
Figure 6A:
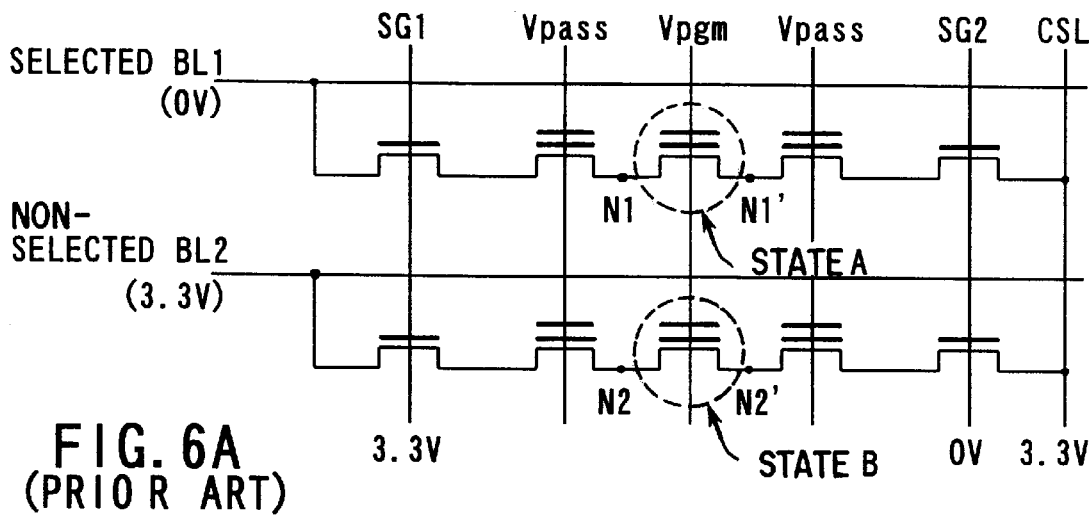
FIGS. 6A to 6C are diagrams for explaining a writing method in the self-boosting system.
Figure 6B:
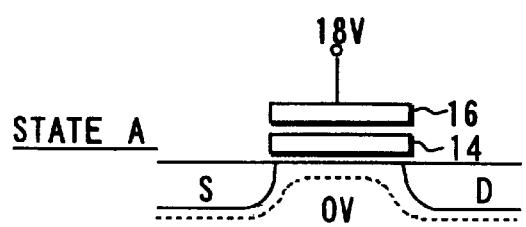
Figure 6C:
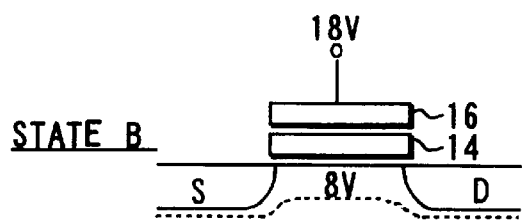
Figure 7:
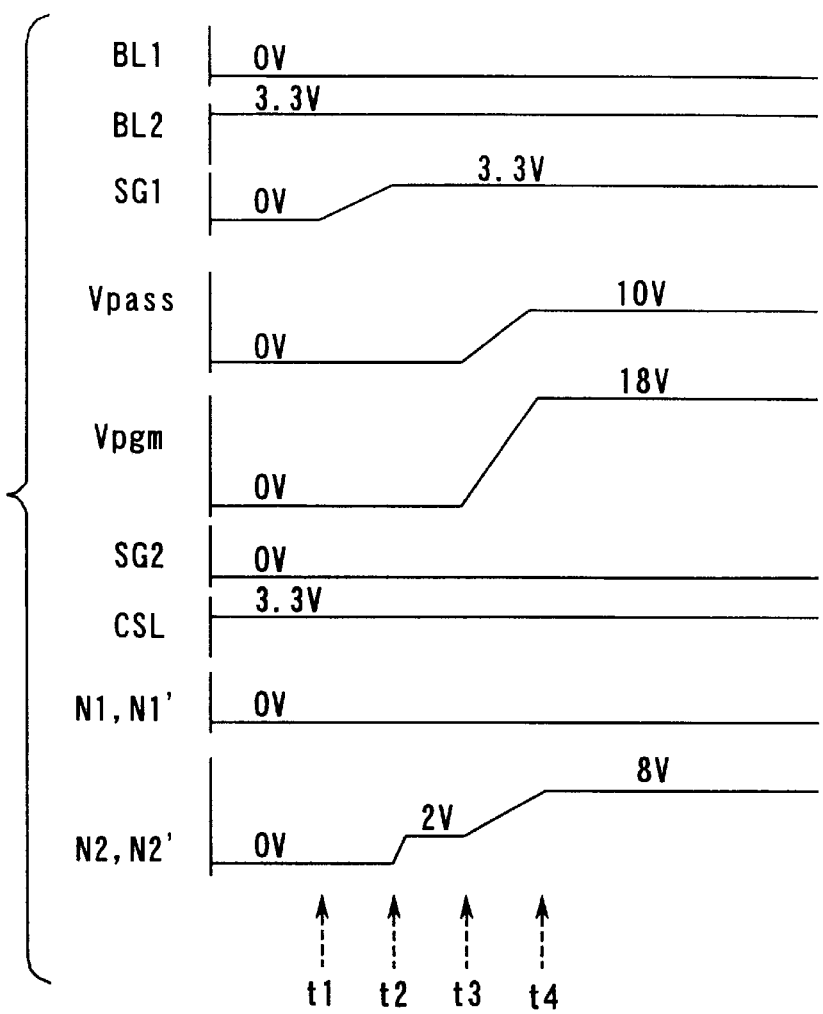
FIG. 7 is a diagram for explaining voltage control timing in a writing operation in the self-boosting system.

FIGS. 6A to 6C are diagrams for explaining a writing method in the self-boosting system of K. D. Suh et al. FIG. 7 is a diagram for explaining timings when voltages are applied to the respective portions in a writing operation.

As shown in FIG. 6A, 0 V is applied to a selected bit line BL1, while 3.3 V is applied to a non-selected bit line BL2. At a timing t1 in FIG. 7, the potential at the selection gates SG1 of selection transistors on the drain side is boosted from 0 V to 3.3 V, thereby turning on the transistors, so that the memory cell columns are connected to the bit lines BL1 and BL2. On the other hand, 0 V is applied to a selection gate SG2 of a selection transistor on the source side, thereby turning off the transistor, so that the memory cell column is disconnected from a common source line CSL. As a result, the potential Vch in a channel in the cell column between the gates SG1 and SG2 of the two selection transistors is 0 V in any portion of the selected cell column connected to the bit line BL1. Meanwhile, 3.3 V is applied to non-selected cell columns through the bit line BL2.

In the above description of the writing operation, the "non-selected" state as expressed by the terms "non-selected bit line" and "non-selected cell column" means a state of shifting the threshold voltage to a positive level, wherein writing of data "0" is inhibited. The same applies to the following description.

Referring to FIG. 6A again, a writing operation in the selected cell column will be described. A high voltage Vpgm (e.g., 18 V) for writing is applied to the control gate electrode 16 of only the selected cell. In the state of the selected cell (State A), as shown in FIG. 6B, the potential of the control gate electrode is 18 V and the channel potential is 0 V. When the coupling ratio of the cell is 0.6, the potential difference between the floating gate electrode 14 and the semiconductor substrate 11 is 11 V. At this potential, electrons are injected into the floating gate electrode 14 through the tunnel oxide film and the threshold voltage of the cell becomes positive, with the result that the "0" data writing to the selected cell is carried out. As regards non-selected cells of the selected cell column, an intermediate potential (Vpass, e.g., 10 V) is applied to the control gate electrodes 16. Since the coupling ratio is 0.6, the potential difference between the floating gate electrode 14 and the semiconductor substrate 11 is 6 V. At this potential, a tunnel current is not injected in an ordinary writing period, and data writing is not carried out. Therefore, data is not written in any cell other than the selected cell in State A.

In a NAND cell column connected to the non-selected bit line BL2, a writing operation is inhibited in the following manner. As described before, 3.3 V (source voltage Vcc) is applied to the non-selected bit line BL2. At a timing t1 in FIG. 7, when the potential at the selection gate SG1 of a selected transistor on the drain side is boosted from 0 V to 3.3 V, the selected transistor is turned on and the potential of 3.3 V is supplied through the bit line BL2 to the cell column connected to the bit line. Assuming that data in all the cells of the NAND cell column are "1"; that is, the cells are in the normally-on state, the channel potential Vch of all the cells in the column is Vch=Vcc−Vths, where Vths represents the threshold voltage of the selection gate SG1, and the selection gate SG1 is then turned off. For example, when Vcc=3.3 V and Vths=1.3 V, the channel potential of all the cells in the non-selected column is Vch=3.3−1.3=2 V. Thus, as shown in the lowermost chart in FIG. 7, the channel potential (e.g., the potential at N2 and N2' in FIG. 6) is charged to 2 V in a period between t2 and t3. On the other hand, as shown in FIGS. 6A and 7, since the selection gate SG2 is off (the voltage at SG2 is 0), the channel potential Vch (the potential of the source and drain regions and a diffusion layer between cells) of the non-selected NAND cell column is floating at this time. When the channel is floating, the voltage of the control gate is boosted to a writing voltage (Vpgm=18 V) or an intermediate voltage (Vp=10 V). At this time, since the channel potential is floating, it is bootstrapped from 2 V, the initial level, to 8V by the voltages applied to the control gates (State B in FIG. 6C), as clear from the potential at N2 and N2' shown in the lowermost chart of FIG. 7. The level of the self-boosted voltage is determined on the basis of Vpass=10 V, not Vpgm=18 V for the following reason: assuming that 16 memory cells are connected in series to constitute a NAND cell column, since Vpgm=18 V is applied to only one control gate, while Vpass=10 V is applied to 15 gates, i.e., all the other control gates, the influence of Vpass=10 V is much greater than that of Vpgm=18 V.

As a result of the self-boosting described above, in the non-selected NAND cell column shown in FIG. 6C, State B, although the writing voltage applied to the control gate electrode 16 is Vpgm=18 V and the potential of the floating gate electrode 14 is about 11 V (18 V×0.6), the voltage applied to the tunnel oxide film between the substrate and the floating gate electrode 14 is merely 3 V. Consequently, no tunnel current flows and data writing in the non-selected NAND cell column is inhibited.

In the cells other than the State B cell in the non-selected NAND cell column, the voltage of the control gate electrode 16 is Vpass=10 V, the voltage of the floating gate electrode 14 is 6 V (10 V×0.6), and the channel potential is about 8 V. Thus, since the voltage applied to the tunnel oxide film is 2 V, data is not written in the cells.

As clear from the above description, the self-boosting system of K. D. Suh et al. has the following advantages.

(1) The amplitude of the potential of a bit line can be reduced from the amplitude 0 V→$V_M$ (e.g., 10 V) in the conventional system to 0 V→Vcc (e.g., 3.3 V). Therefore, the withstand voltages of various transistors for driving the bit line can be lowered, and element refinement can be achieved. In addition, the area of a sense amplifier unit, etc. and the chip size can be reduced.

(2) Since an intermediate potential generating circuit for a bit line voltage is not required, the chip size can be reduced.

However, the self-boosting system of K. D. Suh et al. has drawbacks as described below.

If data is to be written after all the NAND cells have been erased, the channel potential can be fully boosted when the control gate voltage rises in a period between t3 and t4 shown in FIG. 7. However, self-boosting is carried out in a state where data remains in a cell and the threshold voltage of the cell transistor has been boosted to a positive level, Vpass and Vpgm exceed the threshold voltage of the cell storing data (e.g., +1 V) in the period between t3 and t4. Therefore, the channel portion becomes floating and bootstrap is started, only after all the cell transistors of the same NAND cell column are turned on. In this case, Vch after the channel boosting is lower than Vch after erasure, for the following reasons.

Assume that the source voltage is Vcc, the threshold voltage of a memory cell is Vth, the threshold voltage of a selection gate is Vths, a writing voltage is Vpgm, and the intermediate voltage (write inhibiting voltage) is Vpass. After Vpgm and Vpass are boosted from 0 V, the potential Vch of the channel portion has a level given by the following equation:

$$Vch = Vch\phi + (\beta/16)[(Vpgm - Vth - Vch\phi) + 15(Vpass - Vth - Vch\phi)] \quad (1)$$

where $$Vch\phi = Vcc - Vths \quad (2)$$

β represents the ratio of the channel potential to the potential of the control gate. As disclosed in the publication of K. D. Suh et al. (IEEE Journal of Solid-State Circuits, vol. 30, No. 11 (1995)), the following equations are obtained.

$$Vch = [Cins/(Cins + Cchannel)]Vwl \quad (3)$$

$$\beta = [Cins/(Cins + Cchannel)] \quad (4)$$

Figure 8:
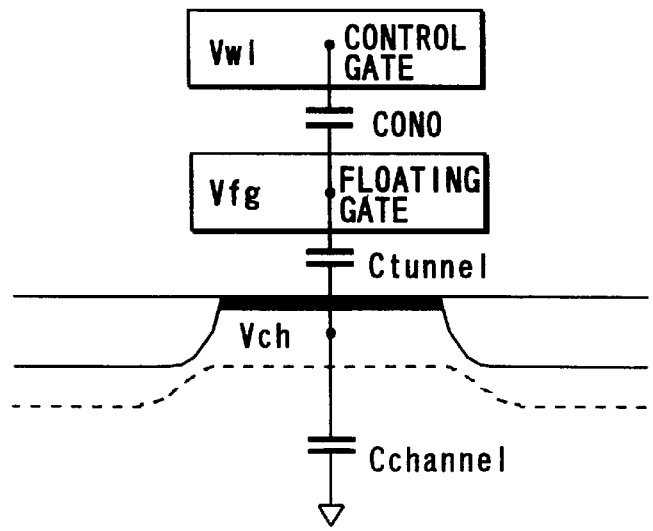
FIG. 8 is a diagram analytically showing electrode potentials and capacities between electrodes in a memory cell transistor.

In general, the value of β is about 0.8. Cins, which represents all the capacitance between the control gate and the channel, is given by the following equation:

$$1/Cins = 1/Cono + 1/Ctunnel \quad (5)$$

where Cono represents the capacitance of an inter-insulating film between the floating gate and the control gate, and Ctunnel represents the capacitance of a tunnel oxide film (see FIG. 8). Cchannel represents the capacitance between the channel and the substrate, and Vwl represents the potential of the control gate.

When Vch is calculated, in the cases where the threshold voltage of the cell is −1 V and +1 V, by use of the above equation (1), the following levels are obtained.

$$Vch = 9.7V (Vth = -1V) \quad (6a)$$

$$Vch = 8.1V (Vth = +1V) \quad (6b)$$

In this calculation, it is assumed that Vcc=3.3 V, Vth=1 V, β=0.8, Vpgm=18 V, Vpass=10 V, and Vth=−1/+1 V. On this condition, Vch φ=3.3−1=2.3 V.

Based on the above results, the state where data is erased from all the 16 cells and the threshold voltage is −1 V will be compared, in the following description, with the state where data is written in all the 16 cells and the threshold voltage is +1 V.

Figure 9:
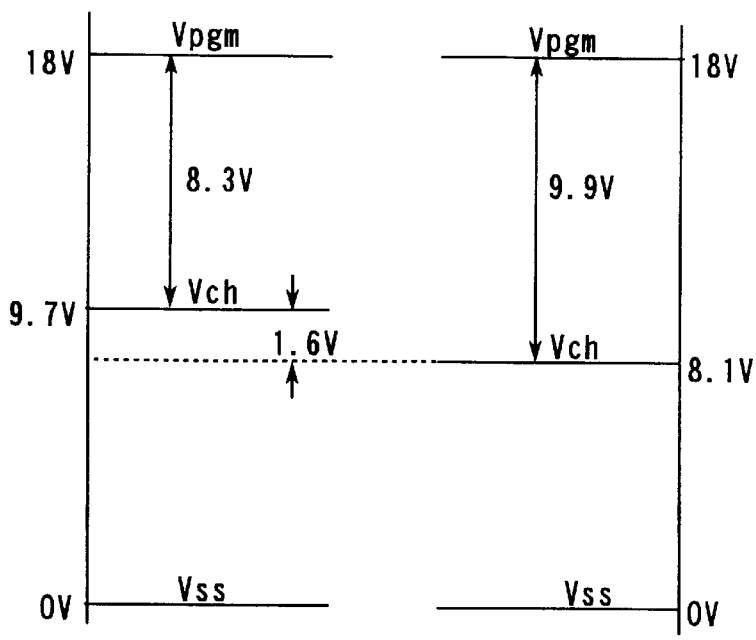
FIG. 9 is a diagram showing potentials applied to the respective electrodes in State B in FIG. 6C.

As shown in FIG. 9, when the threshold voltages of all the cells are −1 V, the potential Vch of the channel of the NAND cell column connected to the non-selected bit line is 9.7 V. On the other hand, when the threshold voltages of all the cells are +1 V, the potential Vch of the channel of the NAND cell column connected to the non-selected bit line is 8.1 V. The difference between the potentials is 1.6 V (=9.7 V−8.1 V). As shown in FIG. 9, the difference between Vch and Vpgm is greater in the case of Vth=+1 V than in the case of Vth=−1 V; that is, the stress to a cell in State A is greater in the former case. In other words, the Vpgm stress is 8.3 V when the threshold voltages of all the cells are −1 V, whereas it is as great as 9.9 V when the threshold voltages of all the cells are +1 V. This is because the channel potential Vch is boosted in different amounts depending on the threshold voltages of the cells. As a result, when data is written into the selected cell in the selected NAND cell column, the stress due to Vpgm varies the cells of in the non-selected NAND cell column, which means lower reliability in the write inhibition.

To overcome the above drawbacks of the self-boosting system, T. S. Jung et al. devised the local self-boosting (LSB) system in which a selected cell can be selectively self-boosted. The system brings great effects to reduce the Vpgm stress, and particularly the variance in threshold voltages of multileveled cells (T. S. Jung et al., ISSCC Tech. Dig., p.32, 1996).

Figure 10:
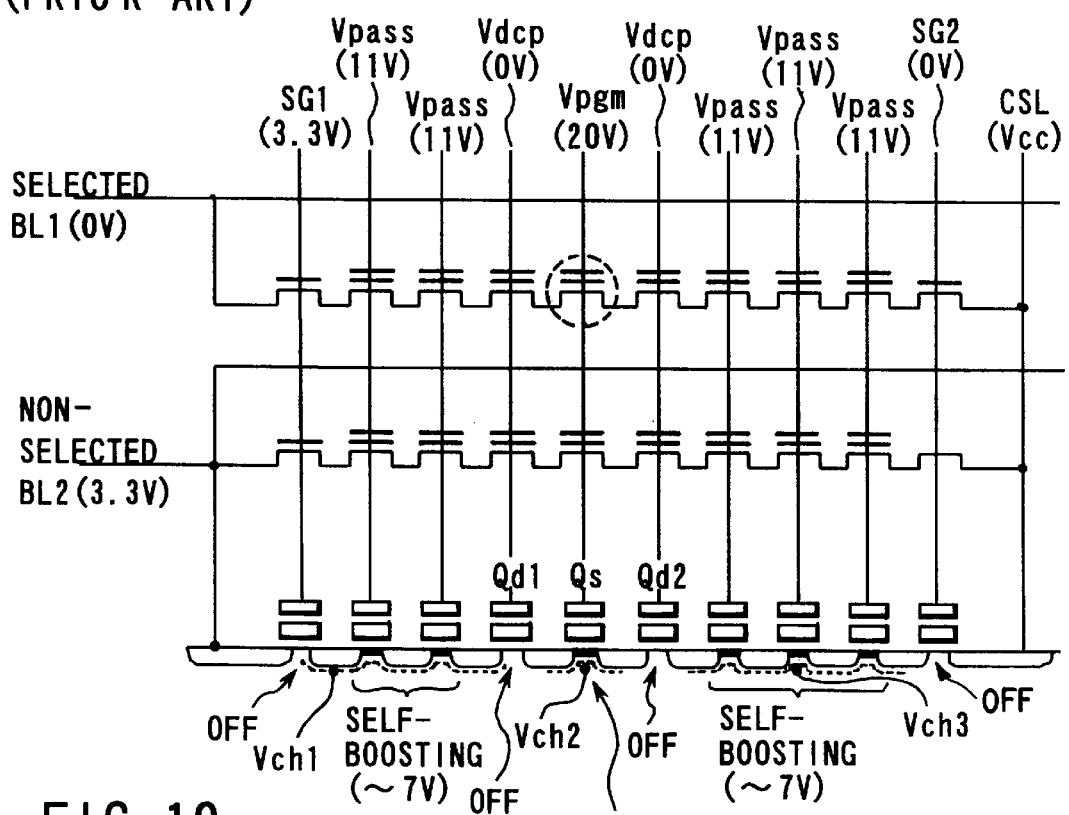
FIG. 10 is a diagram for explaining a writing method in the local self-boosting system.

In the LSB system, as shown in FIG. 10, Vpgm (e.g., 20 V) is applied to the control gate of a selected cell, while Vdcp (0 V) is applied to the two control gates adjacent to the control gate of the selected cell. An intermediate potential Vpass (e.g., 11 V) is applied to the other control gates. As a result, two cell transistors Qd1 and Qd2, to which the potential Vdcp is input, are turned off, and the NAND cell column is divided into three channel regions 1, 2 and 3 (indicated by Vch1, Vch2 and Vch3, respectively). In the channel regions 1 and 3 in the non-selected NAND cell columns, the potentials Vch1 and Vch3 of the channel regions are self-boosted to 7 V by the intermediate potential Vpass (e.g., 11 V) applied to the control gate of the cell transistor in accordance with the mechanism described above. The potential Vch2 of the channel region 2 in the cell of the non-selected NAND cell column which shares the same control gate with the selected cell, i.e., the potential of the cell Qs storing data "1", is also self-boosted by the voltage Vpgm (20 V) applied to the gate of the selected cell. In this case, however, since the adjacent cell transistors Qd1 and Qd2 are off, the potential Vch2 in the channel region 2 is not influenced by the self-boosting in the channel regions 1 and 3. Therefore, the potential Vch2 of the channel region 2 is self-boosted by the voltage Vpgm (20 V) higher than the voltage Vpass (FIG. 11) to about 10 V, much higher than the voltages (Vch1 and Vch3) of the other channel regions 1 and 3. In this way, local self-boosting is started, in which channel potential of only the cell storing data "1" is higher than the channel potentials of the other cells. This is because, as described before, the cell transistors on both sides of the cell Qs storing data "1" are off, and the cell Qs is self-boosted by Vpgm only, without influence of Vpass.

Figure 11:
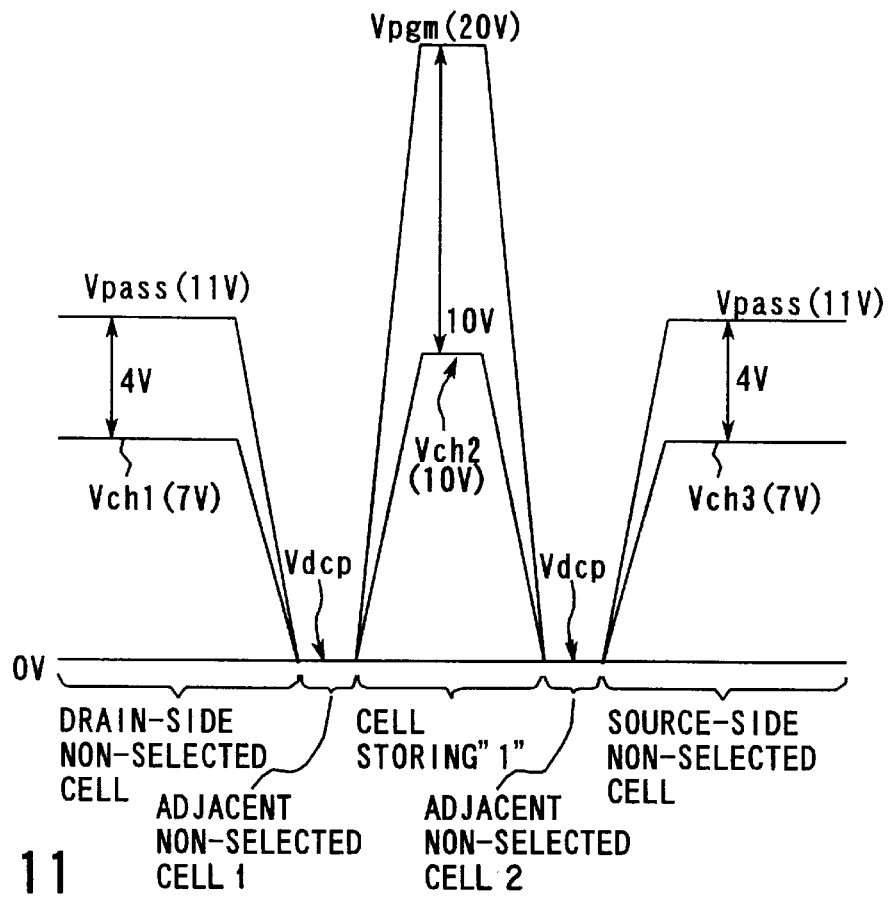
FIG. 11 is a diagram showing the relationship between a potential applied to each electrode and a channel potential in a writing operation in the local self-boosting system.
Figure 12:
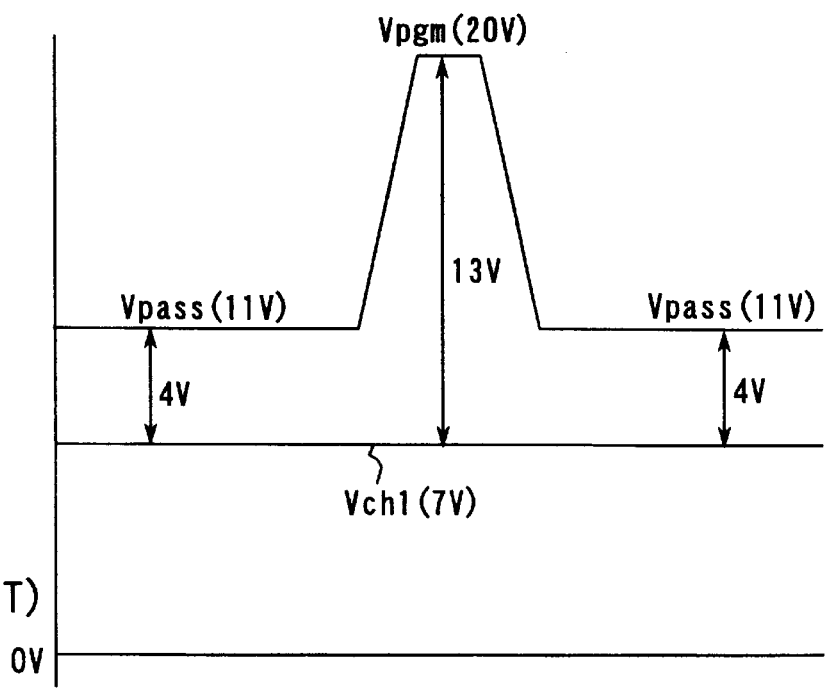
FIG. 12 is a diagram showing the relationship between a potential applied to each electrode and a channel potential in a writing operation in the self-boosting system.

The local self-boosting system is more advantageous as compared to the conventional self-boosting system in the following respect. In the conventional self-boosting system, the channel potential is uniformly self-boosted to 7 V, as shown in FIG. 12. Contrarily, in the local self-boosting system, the channel potential of the cell storing data "1" is 10 V, as shown in FIG. 11. The stress to the cell is Vpgm−Vch1=20−7=13 V in the conventional self-boosting system, whereas the stress to the cell is Vpgm−Vch2=20−10=10 V in the local self-boosting system. Thus, the stress is 3V lower in the local self-boosting system. Thus, this system has a high reliability in inhibition of writing by Vpgm in the non-selected NAND cell column.

However, in the local self-boosting system, the following problem arises when data is written in a selected NAND cell column. As described before, the potential of the bit line is 0 V in the selected NAND cell column. This potential 0 V must be transmitted to a selected memory cell to which data is to be written. In other word, to write data in the selected cell, the encircled cell in FIG. 10, it is necessary that all the cells located between the selected cell and the bit line BL1 be on. In the local self-boosting system, Vdcp=0 V is applied to the adjacent cells on both sides of the selected cell. If the adjacent cells are depleted, i.e., in the normally-on state (if the threshold voltage is negative), the potential 0 V of the bit line BL1 is transmitted to the selected cell and data is written therein. On the other hand, if the adjacent cells are enhanced, i.e., normally off (if the threshold voltage is positive), the potential 0 V of the bit line BL1 is not transmitted to the selected cell and no data is written. For this reason, when data is to be successively written in a plurality of cells in a selected NAND cell column, it is necessary that data be written in the order from the source side (farthest cell from the bit contact) toward the bit line.

Embodiments of the present invention will now be described on the basis of the above matters.

[Embodiments based on a first aspect of the present invention]

First to fifth embodiments based on a first aspect of the present invention will be described first. In the following, a process of writing in a NAND EEPROM will be mainly described.

Figure 13:
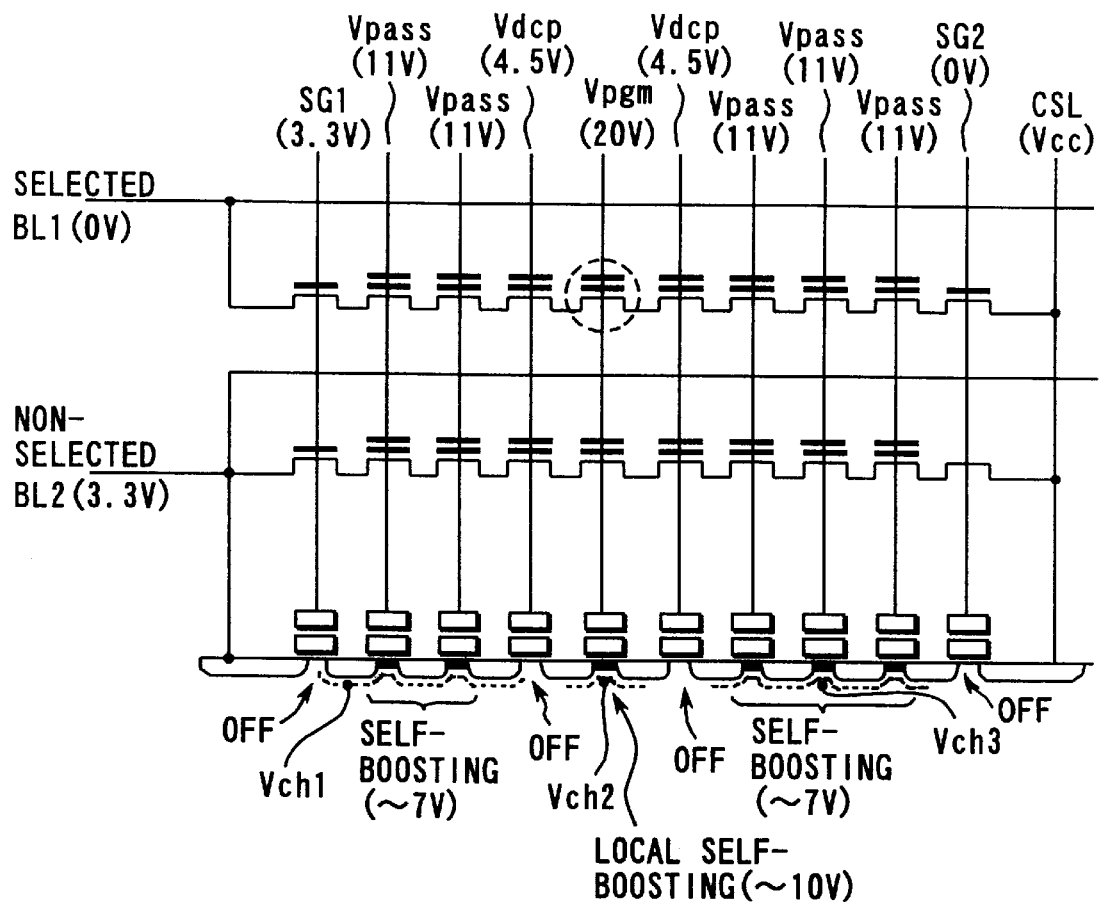
FIG. 13 is a diagram showing voltage control in a writing operation in an improved selective writing system according to a first embodiment of the present invention.

FIG. 13 is a diagram showing voltage control in a NAND EEPROM according to the first embodiment of the present invention. A plan view, an equivalent circuit diagram, and longitudinal and lateral cross-sectional views of this embodiment are the same as those shown in FIGS. 1A, 1B, 2 and 3.

As shown in FIG. 13, the voltage Vpgm (e.g., 20 V) is applied to the control gate of a selected memory cell, which is encircled in the drawing. A lower voltage Vdcp (e.g., 4.5 V), much lower than a voltage Vpass (to be described below), is applied to the control gate of the memory cells adjacent to the selected memory cell. The voltage Vpass (e.g., 11 V) is applied to the other control gates. It is important that the positive voltage Vdcp=4.5 V is applied to the adjacent memory cells in this embodiment, in contrast to the local self-boosting system of T. S. Jung et al. in which Vdcp is 0 V.

Figure 21:
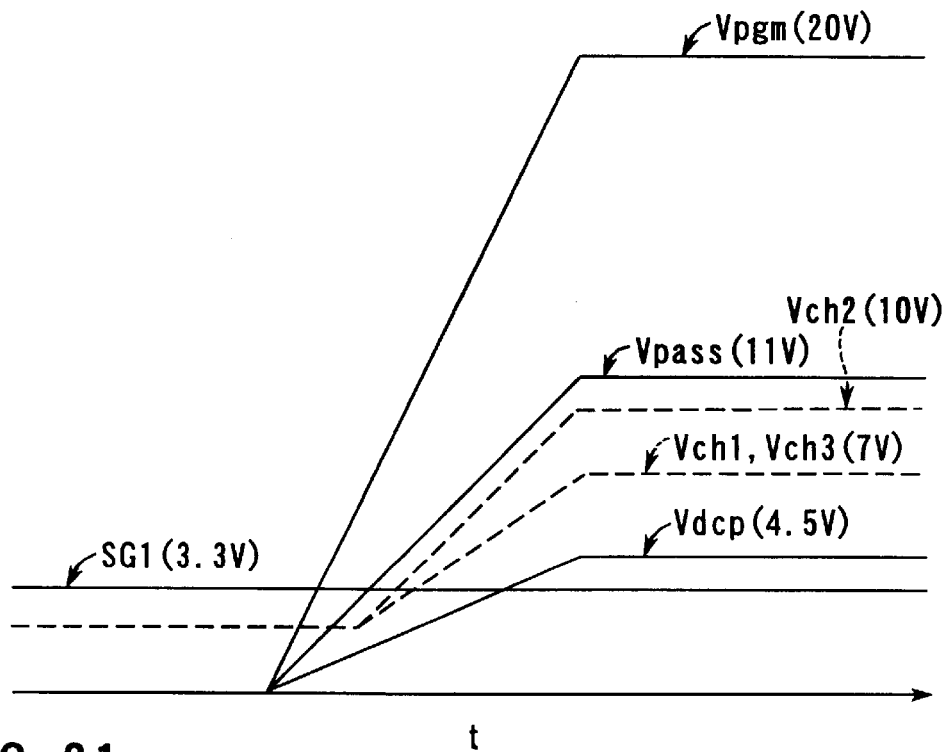
FIG. 21 is a diagram showing voltage control timing in the improved selective writing system according to the first embodiment of the present invention.

By the above voltage control, the write inhibition can be achieved in the same manner as in the local self-boosting system of T. S. Jung et al. in a non-selected NAND cell column. More specifically, when the voltage of Vcc(3.3 V)−Vth is supplied to a selected transistor SG1 from the bit line, the transistor SG1 is turned off and self-boosting is started in the same manner as in the case of K. D. Suh et al. At the same time, the cell to which Vdcp=4.5 V is applied is turned off, since the potential of the control gate electrode of the cell becomes lower than the channel potential. As a result, the channel portion is divided into three channel regions 1, 2 and 3 (indicated by Vch1, Vch2 and Vch3, respectively) as in the case of T. S. Jung et al. (see FIGS. 13 and 14). The potential of the channel region Vch2 of the memory cell storing data "1" is self-boosted from 0 V to 10 V as Vpgm rises from 0 V to 20 V, since the adjacent cells are off. The state of boosting is shown in a timing chart of FIG. 21. On the other hand, the potentials of the channel regions Vch1 and Vch3 are boosted to 7 V as Vpass rises from 0 V to 11 V. Thus, the channel potential Vch2 of the cell storing data "1" is higher than the channel potentials Vch1 and Vch3. As a result, the potential difference between Vpgm and Vch2 is smaller than that in the self-boosting system of K. D. Suh et al., and the stress to the cell is reduced.

In the selected NAND cell column, even if the column includes a cell in which data has been written, data can be selectively written without fail.

Figures 14, 15:
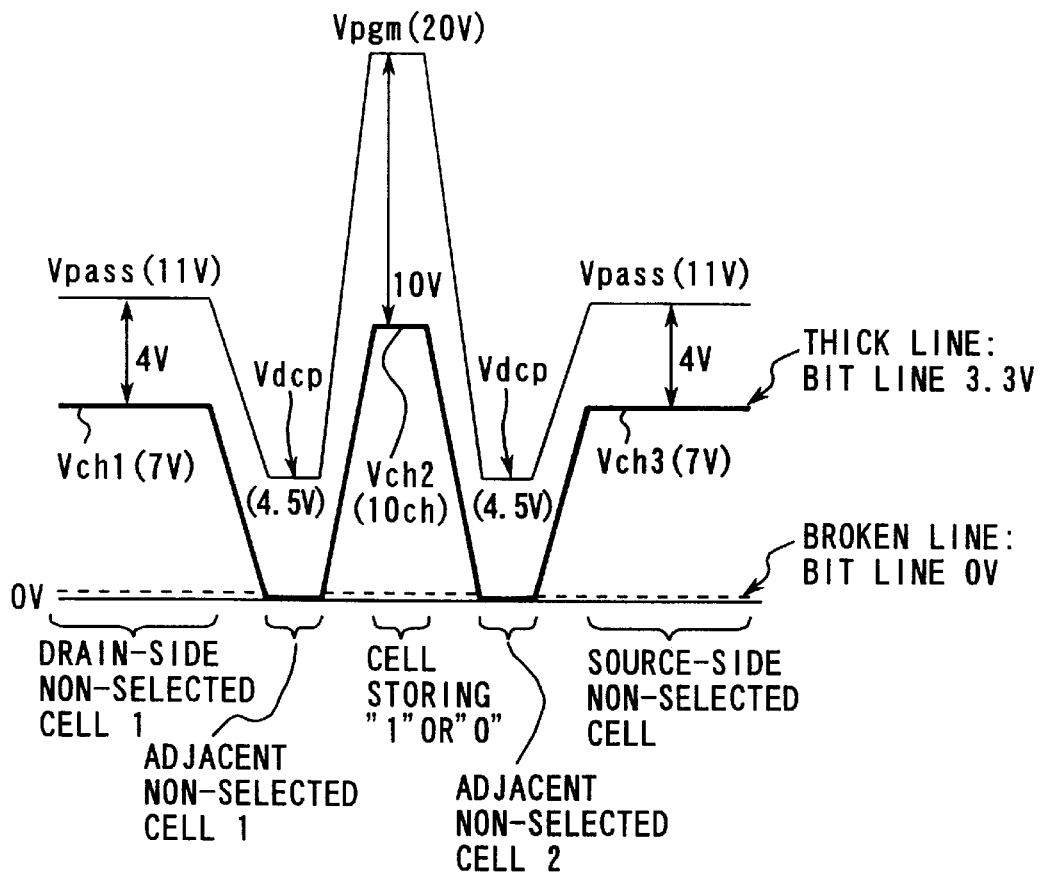
FIG. 14 is a potential relationship diagram for explaining a writing operation in the improved selective writing system according to a first embodiment of the present invention.
FIG. 15 is a table showing the relationship between time and a rise of a channel potential in a NAND memory cell.
Figure 16:
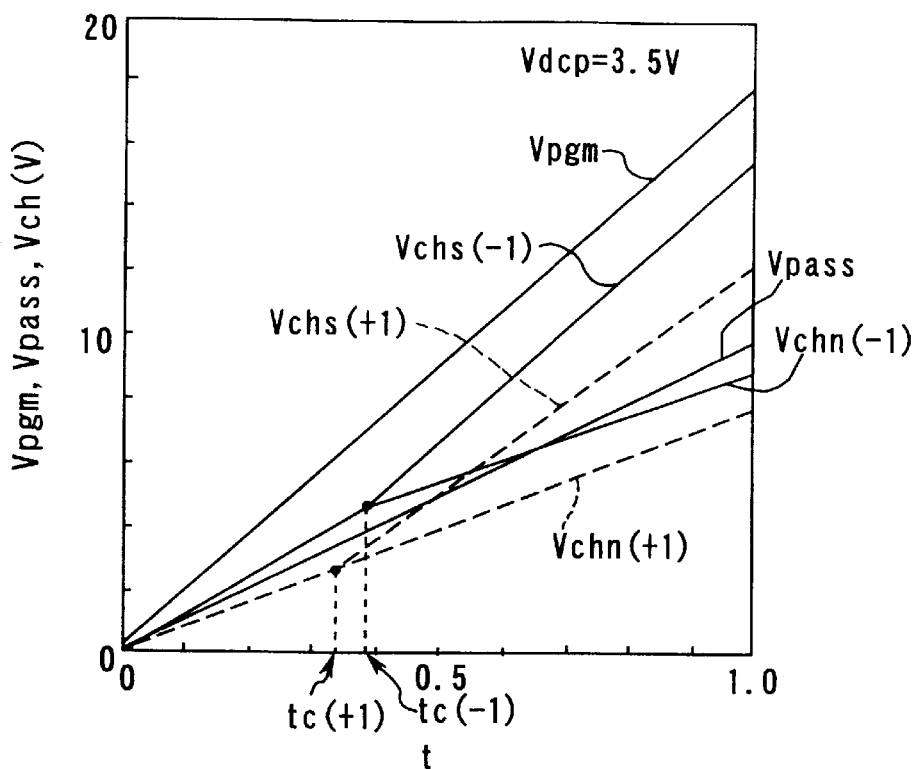
FIG. 16 is a diagram which graphs out part of data indicated in the table shown in FIG. 15.
Figure 17:
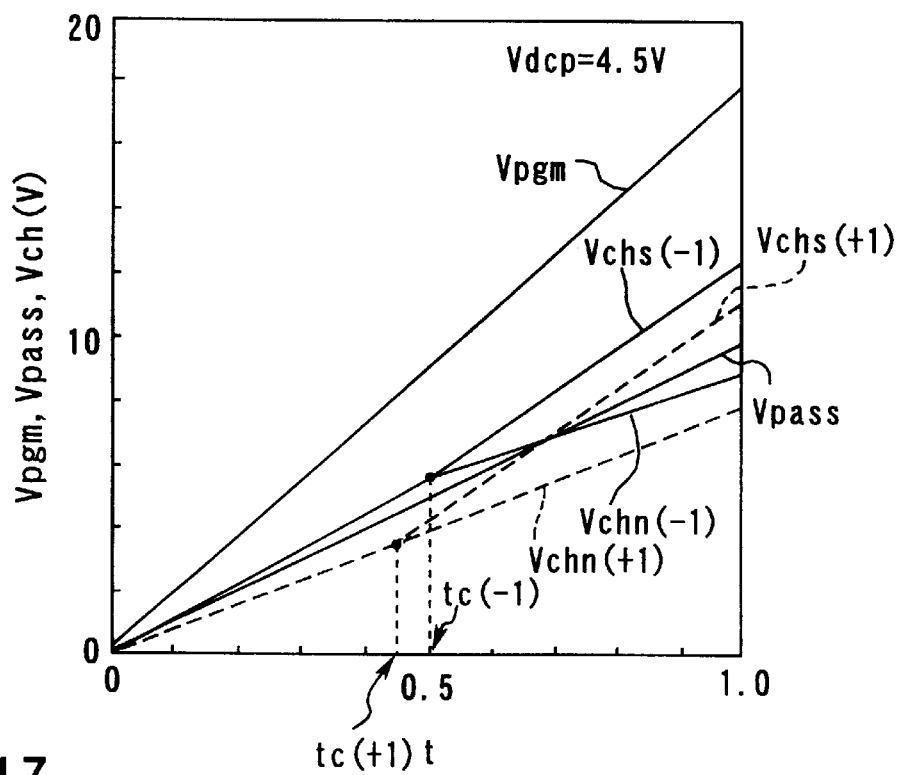
FIG. 17 is a diagram which graphs out part of data indicated in the table shown in FIG. 15.
Figure 18:
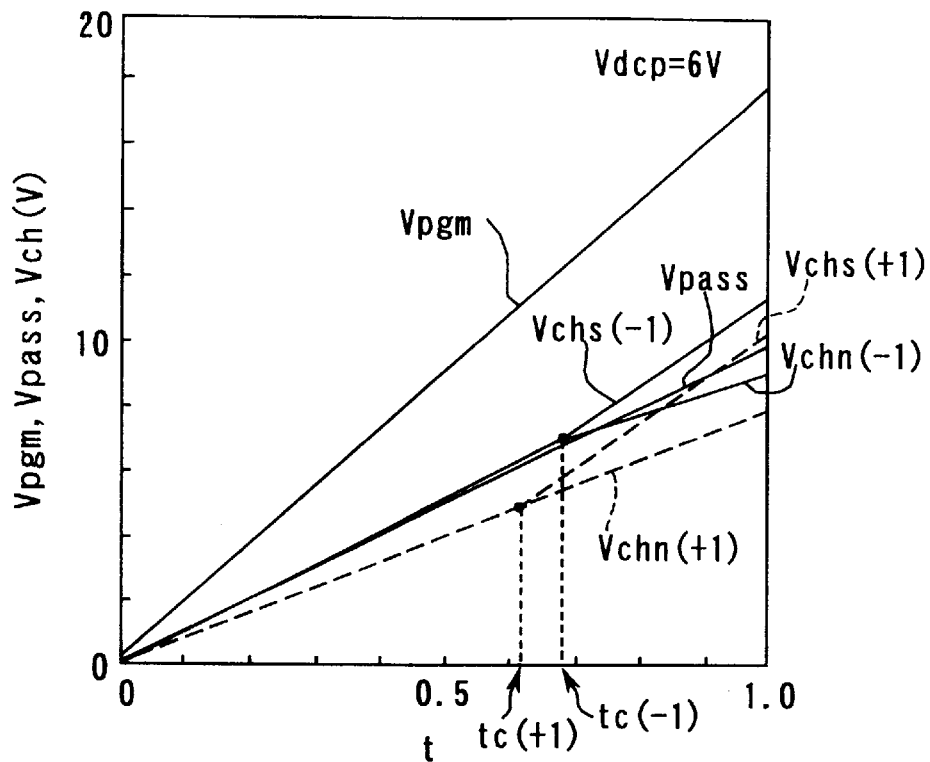
FIG. 18 is a diagram which graphs out part of data indicated in the table shown in FIG. 15.
Figure 19:
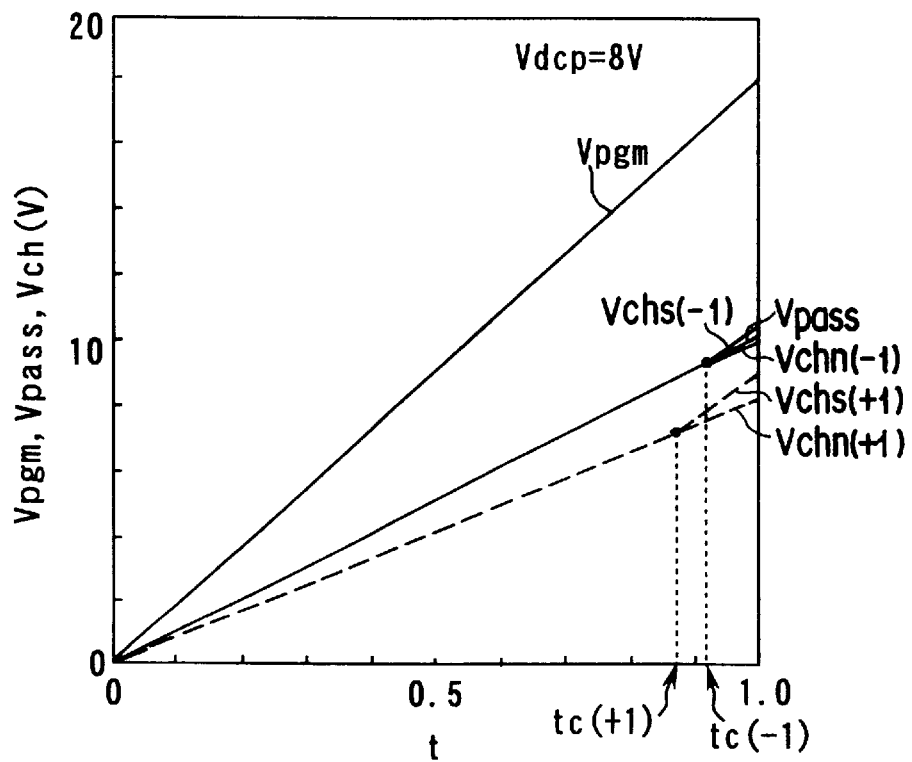
FIG. 19 is a diagram which graphs out part of data indicated in the table shown in FIG. 15.

To write data in an encircled cell in FIG. 13, when a selection gate SG1 is opened and connected to the bit line BL1, the potential of all the channel portion of the NAND cell column becomes 0 V, as indicated by a broken line in FIG. 14. In this case, the local self-boosting system of T. S. Jung et al. has the following problem: when an adjacent non-selected cell 1 is in the normally-off state, the voltage of the bit line BL1 cannot be transmitted to the selected cell, since Vdcp=0, as described before with reference to FIG. 11. In contrast, according to this embodiment, since Vdcp=4.5 V (higher than the threshold voltage of the normally-off cell) is applied to the adjacent non-selected cells 1 and 2 as shown in FIG. 14. Therefore, even if the adjacent cell is normally off, it can be turned on, and the potential of 0 V of the bit line BL1 can be transmitted to the channel region of the selected cell. As a result, in the selected cell, desired data can be written by the potential difference (20 V) between the control gate potential Vpgm=20 V and the channel potential Vch=0 V. In the other cells, since the voltage Vpass=11 V is applied to the control gate, even if the cells are in the normally off state, they can be turned on and data can be written in the selected cell without fail.

In the above embodiment, the gate potential Vdcp of the cells adjacent to the selected cell is 4.5 V. However, a desirable level of Vdcp is not limited to this level, but can be any level within a predetermined range. Desirable lower limit Vdcpmin and upper limit Vdcpmax of the level of Vdcp will be described below.

First, the lower limit Vdcpmin is described.

In a writing operation, in order that the potential Vch φ (2.3 V) on the high potential side on the bit line may be transmitted without a drop of the threshold voltage, it is necessary that the following conditions be satisfied:

$$Vdcp > Vch\phi + Vths \tag{7}$$

where $$Vch\ \phi=2.3\ V\ \text{and}\ Vth=1\ V \tag{8}$$

From these formulas, the lower limit level Vdcpmin=3.3 V can be obtained. If the drop of the threshold voltage is permitted to some extent, then the lower limit level Vdcpmin may be 2 V.

Next, the lower limit Vdcpmin is described.

It is assumed that 16 cells are connected in series in a NAND cell. Further, as in the above description, it is assumed that the source voltage is Vcc, the threshold voltage of a memory cell is Vth, the threshold voltage of a selection gate is Vths, the writing voltage is Vpgm, and the intermediate voltage (write inhibiting voltage) is Vpass.

The potential Vch in a channel region after the voltages Vpgm and Vpass are boosted from 0 V is calculated as follows. In the following calculation, it is assumed that Vdpc does not vary with time for the purpose of simplification (although Vdcp actually is slightly variable with time in this embodiment and second to fourth embodiments to be described later, the change of Vdcp in accordance with the change of Vpgm and Vpass can be roughly analyzed by the following calculation).

It is assumed that the initial level of Vpgm and Vpass are 0 (time t=0). Time t=1 is a time when Vpgm and Vpass finally reach the levels satisfying the data writing. Therefore, 0<t<1 represents an intermediate state.

The channel voltage Vch (t) in the NAND cell at the time t is obtained by the following equation:

$$Vch(t)=Vch\phi+(\beta/14)[(tVpgm-Vth-Vch\phi)+13(tVpass-Vth-Vch\phi)] \tag{9}$$

where $$Vch\phi=Vcc-Vths \tag{10}$$

In the above equation (9), it is assumed that two cells to which the voltage Vdcp is applied do not contribute to bootstrapping, while the other 14 cells contribute to bootstrapping. For example, assuming that Vpgm=18 V, Vpass=10 V, β=0.8, Vch φ=2.3(V)=3.3(V)−1(V), the following equation is obtained from the equation (9).

$$Vch(t)=8.457t-0.8Vth+0.46(V) \tag{11}$$

While the value of t is small, the two cells (the adjacent cells on both sides of the selected cell), to which the voltage Vdcp is applied through their gate, are on. Therefore, the channel potential Vch (t) rises in accordance with the rise of Vpgm and Vpass, and has the same level in the overall channel region. The instant the instant the channel potential Vch (t) becomes equal to Vdcp−Vthx (Vthx represents threshold voltages of control gates of the adjacent cells), the adjacent cells on both sides of the selected cells are turned off, and the channels of the selected cell and the other cells (non-selected cells) are turned off. Thus, the self-boosting in the overall channel is completed. Thereafter, the channel of the selected cell is self-boosted and the potential thereof rises. Although the channels of the non-selected cells are also self-boosted, the potentials thereof are lower than the channel potential in a case of the local self-boosting.

When the condition $Vch(t)=Vdcp-Vthx$ is substituted in the equation (11), the following equation is obtained.

$$Vdcp-Vthx=8.457t-0.8Vth+0.46 \tag{12}$$

Since the threshold voltage Vth of a non-selected cell can be various levels, a huge number of levels must be calculated for all the threshold voltages. In the following, for the purpose of simplification, only two cases in which the threshold voltage Vth is −1 V (erasing state) and +1 V (writing state) are described.

The value of t is calculated from the equation (12) as follows:

$$t=(Vdcp-0.2Vth-0.46)/8.457 \tag{13}$$

where Vth=Vths±1 V.

In the above equation (13), in the case of Vth=+1(V), the following equation is obtained.

$$t=(Vdcp-0.66)/8.457 \tag{14a}$$

In the case of Vth=−1(V), the following equation is obtained.

$$t=(Vdcp-0.26)/8.457 \tag{14b}$$

In the above equation (14a), for example, when Vdcp=4.5 V, the following equation is obtained.

$$t=tc=0.45(Vth=+1V) \tag{15}$$

The value of Vch at the time tc is as follows.

$$Vch(tc)=3.47V \tag{16}$$

In the above equation (14b), for example, when Vdcp=4.5 V, the following equation is obtained.

$$t=tc=0.50(Vth=-1V) \tag{17}$$

The value of Vch at the time tc is as follows.

$$Vch(tc)=5.49V \tag{18}$$

Thus, the self-boosting system is changed to the local self-boosting system at the time tc, i.e., about half (0.45 to 0.5) the final value 1 of the time t. In other words, when 0<t<tc, the self-boosting occurs, in which the channels of a selected cell and non-selected cells are connected to each other and self-boosted in the same potential state. On the other hand, when tc<t<1, the channel of a selected cell is disconnected from that of a non-selected cell, so that the selected cell is in the local self-boosting state, whereas the non-selected cell is in the self-boosting state. Further, it is understood from the above equations that the greater the Vdcp, the greater tc.

As described above, at the time t (tc<t<1), the channel region of a selected cell and the channel region of a non-selected cell are boosted in different manners. The boosting of the channel of a non-selected cell is expressed by the following equation (19), whereas the boosting of the channel of a selected cell is expressed by the following equation (20).

$$Vchn=Vch(1)=Vch(tc)+(1-tc)\beta Vpass \tag{19}$$

$$Vchs=Vch(1)=Vch(tc)+(1-tc)\beta Vpgm \tag{20}$$

For example, when Vdcp=4.5 V, the channel potentials are boosted to the following levels.

$$Vchn=7.5V(Vth=+1V) \tag{21a}$$

$$Vchn=9.5V(Vth=-1V) \tag{21b}$$

$$Vchs=10.7V(Vth=+1V) \tag{22a}$$

$$Vchs=12.7V(Vth=-1V) \tag{22b}$$

The theoretical upper limit (maximum level) of Vdcp is a condition of causing the local-self boosting immediately before tc=1. Therefore, when tc=1 is substituted in the equations (14a) and (14b), the following maximum levels are obtained.

$$Vdcpmax=9.1V(Vth=+1V) \tag{23a}$$

$$Vdcpmax=8.7V(Vth=-1V) \tag{23a}$$

In other words, when the self-boosting is switched to the local self-boosting at final levels of Vpgm and Vpass (tc=1), Vdcp corresponds to its upper limit (maximum level) Vdepmax. Of the above equations (23a) and (23b), the lower level of Vdcpmax is 8.7 V. Since Vpass is 10 V, Vdcpmax is clearly lower than Vpass.

Based on the above equations, the range of the theoretical level of Vdcp is as follows.

$$2.0V<Vdcp<8.7V \tag{24}$$

FIG. 15 shows a table indicating results of calculation of the channel potential in a NAND memory cell in four cases of Vdcp=3.5 V, 4.5 V, 6 V and 8 V, when 0<t<1. FIGS. 16 to 19 are diagrams which graph out the results.

In the graphs of FIGS. 16 to 19, the abscissa represents the time t and the ordinate represents Vpgm, Vpass and Vch (Vchs and Vchn). Vchs(+1) represents the channel potential of a selected cell when Vth=1 V, whereas Vchs(−1) represents the channel potential of the selected cell when Vth=−1 V. Vchn(+1) represents the channel potential of a non-selected cell when Vth=1 V, whereas Vchn(−1) represents the channel potential of the non-selected cell when Vth=−1 V. The time tc(−1) represents the time when the self-boosting and the local self-boosting are switched when Vth=−1 V, whereas the tc(+1) represents the time when the self-boosting and the local self-boosting are switched in the case of Vth=+1 V.

As understood from FIGS. 16 to 19, in the cases of Vdcp=3.5 V (FIG. 16) and Vdcp=4.5 V (FIG. 17), whether Vth is −1 V or +1 V, the local self-boosted potential Vchs is higher than the self-boosted potential of a non-selected cell. Thus, the present invention is effective in these cases. However, if the difference between the local self-boosted potential of a selected cell and the self-boosted potential of a non-selected cell becomes smaller as Vdcp becomes greater, the effect of the present invention cannot be obtained. In particular, when Vdcp=8 V, substantially only the self-boosting occurs.

Therefore, the range of the practical levels of Vdcp in which the effect of the present invention can be obtained is considered to be 3 V≦Vdcp≦6 V.

As clear from the above description, according to this embodiment, if the voltage Vdcp of a suitable level is applied to the gates of cells on both sides of a selected cell and data is written at random in cells in the selected NAND cell column, even if a cell to be written next is located nearer to the source than a cell which has been written, the potential 0 V of the bit line BL1 can be transmitted to the channel portion of the selected cell, with the result that the data writing can be carried out by applying Vpgm to the control gate.

Figure 20:
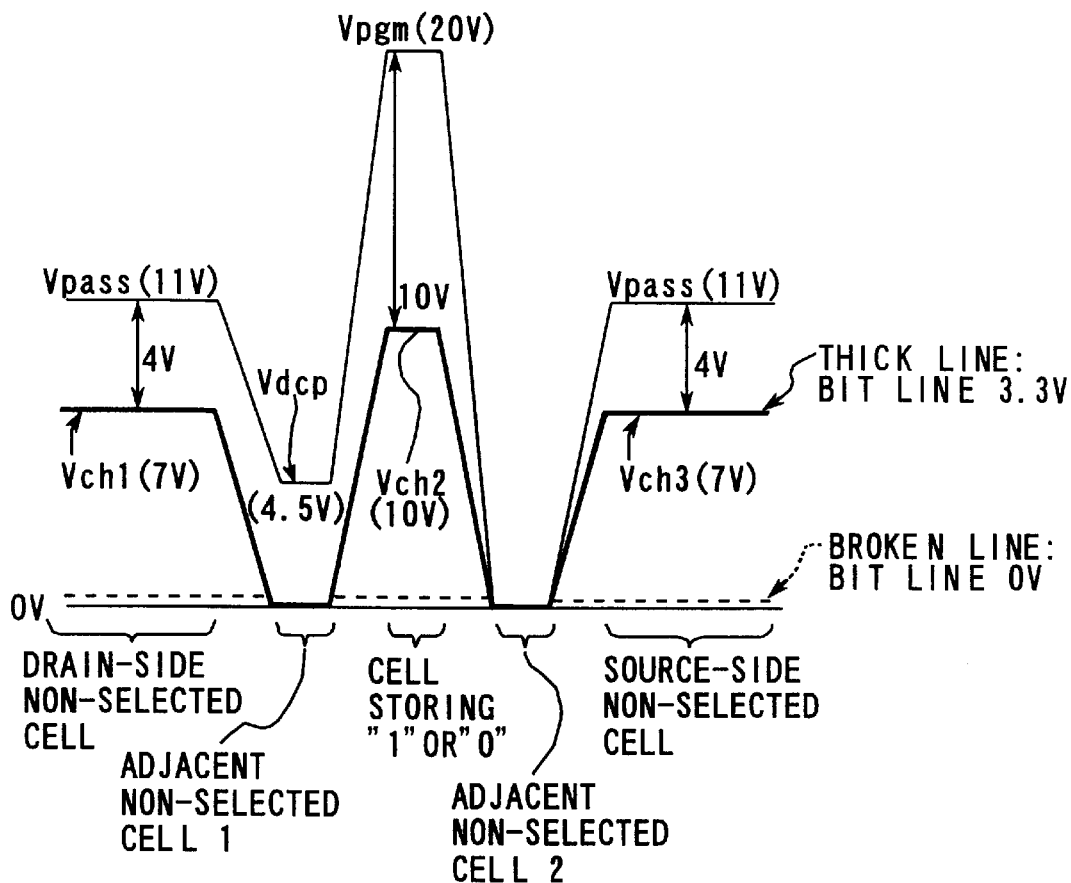
FIG. 20 is a diagram for explaining an operation similar to that shown in FIG. 14, according to a modification of the first embodiment.

To obtain the effect of the first embodiment, it is only necessary that, only one of the two non-selected cells adjacent to the selected cell to which data "0" is to be written, i.e. the cell on the bit line side be conductive. In other words, even if the non-selected cell on the source side is not conductive, data can be written in the selected cell. This structure is shown as a modification of the first embodiment in FIG. 20. As shown in FIG. 20, Vdcp may be applied only to a non-selected cell 1 on the bit line side adjacent to the selected cell, while 0 V is applied to a non-selected cell 2 on the source side. Further, a positive voltage lower than Vdcp may be applied to the non-selected cell 2 on the source side.

Figure 22:
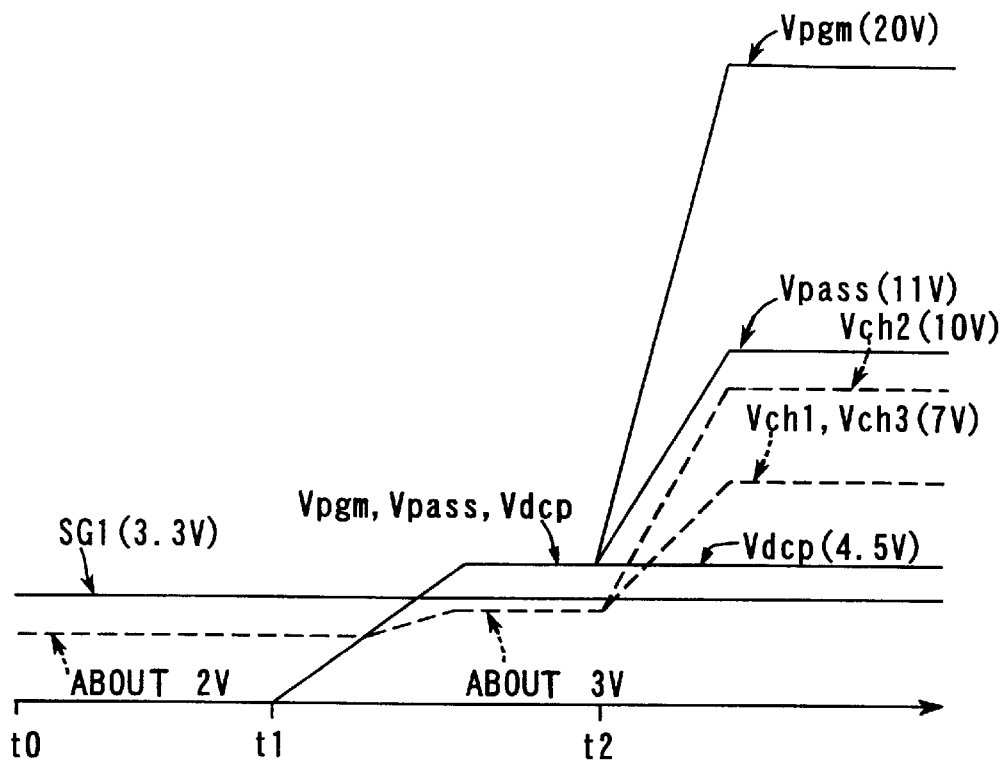
FIG. 22 is a diagram showing voltage control timing in an improved selective writing system according to a second embodiment of the present invention.

A second embodiment of the present invention will be described with reference to FIG. 22. In this embodiment, although the voltage controlling timing is different from that of the first embodiment, the basic operation principle is the same as first embodiment.

In the period between t0 and t1, when the gate voltage of a selected transistor SG1 is set to 3.3 V, channel potentials (Vch1, Vch2, Vch3) of non-selected NAND cell column are charged to about 2 V. In the period between t1 and t2, the potentials of Vpgm, Vpass and Vdcp are risen from 0 V to 4.5 V. As a result, 4.5 V is applied to the control gates of all the eight memory cells, and the channel potential is risen to about 3 V. After the time t2, Vpass is risen from 4.5 V to 11 V, and Vpgm from 4.5 V to 20 V. Consequently, the potential of the channel Vch2 of a cell storing data "1" is 10 V. This is because, after the time t2, the self-boosted channel potential of the memory cells, adjacent to the cell storing data "1", is higher than the voltage (Vdcp=4.5 V) applied to the control gates and is turned off. Also, the other channel potentials (Vch1, Vch2, Vch3) are risen to 7 V. The relationship between the final potentials is the same as the potential relationship shown in FIG. 20. Consequently, write inhibition in the non-selected NAND cell column is achieved in the same manner as in the first embodiment.

In addition, as in the first embodiment, data can be written at random in the selected NAND cell column.

Figure 23:
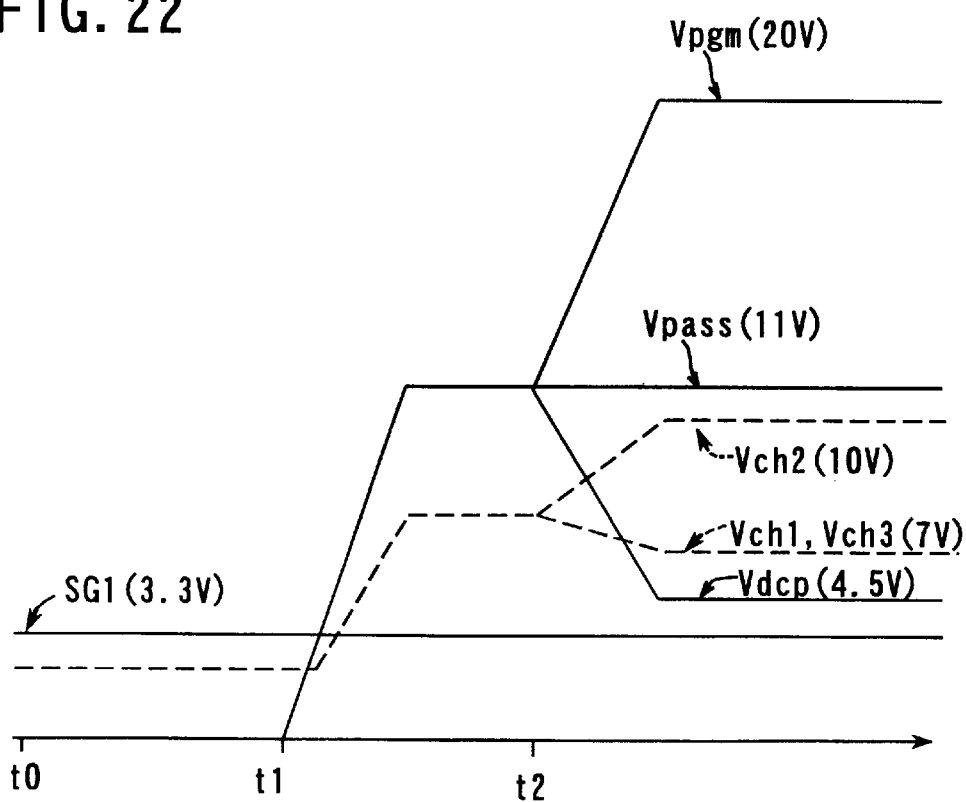
FIG. 23 is a diagram showing voltage control timing in an improved selective writing system according to a third embodiment of the present invention.

A third embodiment of the present invention will be described with reference to FIG. 23. In this embodiment also, although the voltage controlling timing is different from that of the first embodiment, the basic operation principle is the same as first embodiment.

In the period between t1 and t2, the potentials of Vpgm, Vpass and Vdcp are risen to 11 V. At this time, channel potentials Vch1, Vch2 and Vch3 are risen to 7 V. At the time t2, only Vdcp is lowered from 7 V to 4.5 V, thereby turning off the transistors of adjacent cells on both sides of a cell storing data "1". Further, at the time t2, Vpgm is risen from 11 V to 20 V. Consequently, the potential of the channel Vch2 of the cell storing data "1" is boosted to 10 V.

In this embodiment also, the relationship between the final potentials is the same as the potential relationship in the first embodiment. Consequently, write inhibition in the non-selected NAND cell column and data writing in the selected NAND cell column are achieved in the same manner as in the first embodiment.

Figure 24:
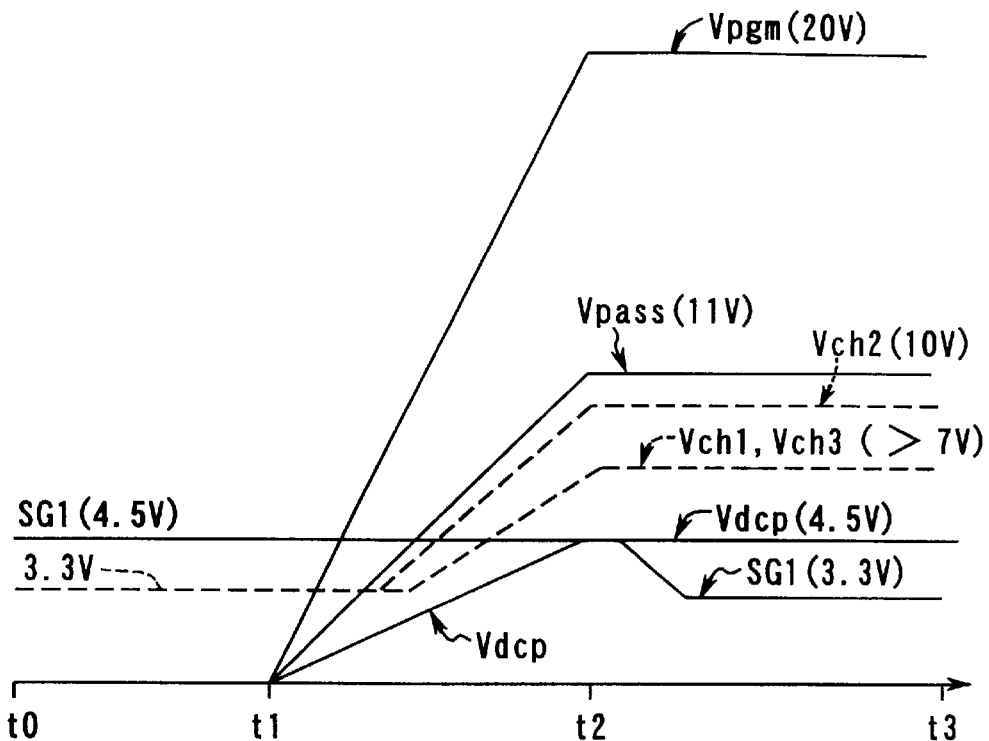
FIG. 24 is a diagram showing voltage control timing in an improved selective writing system according to a fourth embodiment of the present invention.

A fourth embodiment of the present invention will be described with reference to FIG. 24. In this embodiment also, although the voltage controlling timing is different from that of the first embodiment, the basic operation principle is the same as first embodiment.

In the period between t0 and t1, a selection gate SG1 is set to a potential (at least Vcc+Vths, e.g., 4.5 V) higher than Vcc. In this case, since the drop of the threshold voltage due to a selection gate SG1 does not occur and the potential of a bit line BL1 is Vcc, the potential of Vcc (for example, 3.3 V) is transmitted to the channel portion of the NAND cell column.

In the period between t1 and t2, Vpgm is risen from 0 V to a high voltage (e.g., 20 V), Vpass is risen from 0 V to 11 V, and Vdcp is risen from 0 V to 4.5 V. As a result, the potentials of Vch1 and Vch3 are boosted to 7 V and the potential of Vch2 to a level higher than 10 V. Thus, the drop of the threshold voltage (e.g., 1.0 V) due to the selection gate transistor does not occur and the voltages of Vch1, Vch2 and Vch3 can be higher, so that the possibility of an error in writing is further lowered.

In the period between t2 and t3, according to this embodiment, the potential of the selection gate SG1 is lowered from 4.5 V to 3.3 V for the following reasons. In this period, the potentials of the channel regions Vch1, Vch2 and Vch3 of the memory cells are self-boosted to levels higher than those in the first to third embodiments, if the potential of the bit line is lowered even a little due to a noise, a leak current may flow from the floating channel regions to the bit line, thereby lowering the potential of the channel regions, resulting in error in writing. To prevent this, the potential of SG1 is lowered to suppress a flow of a leak current.

Figure 25:
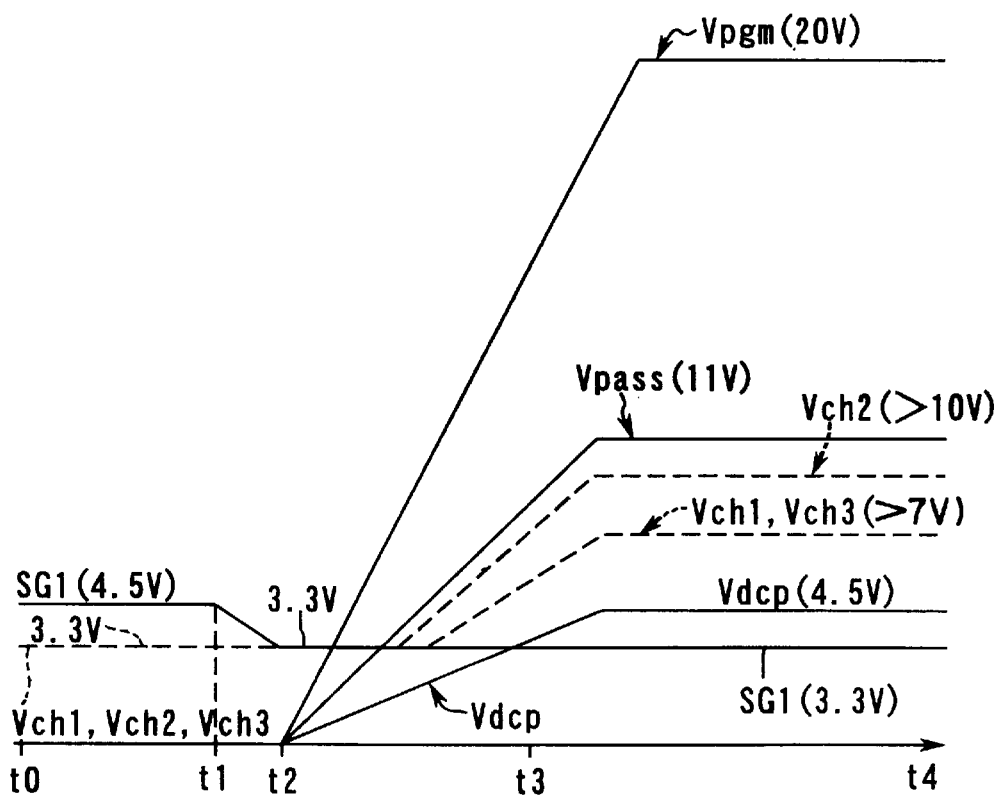
FIG. 25 is a diagram showing voltage control timing in an improved selective writing system according to a fifth embodiment of the present invention.

FIG. 25 shows a voltage controlling timing in a fifth embodiment of the present invention. In this embodiment, as in the fourth embodiment, the potential of a selection gate SG1 is set to a potential (at least Vcc+Vths, e.g., 4.5 V) higher than Vcc in the period between t0 and t1. Since the drop of the threshold voltage does not occur due to a selection gate SG1 and the potential of a bit line BL1 is Vcc, the potential of Vcc (for example, 3.3 V) is transmitted to the channel portion of the NAND cell column.

In the period between t1 and t2, the potential of the selection gate SG1 is lowered from 4.5 V to 3.3 V, for the same reason as in the case of fourth embodiment.

In the period between t2 and t3, the potential of Vpgm is risen from 0 V to a high voltage (e.g., 20 V), Vpass from 0 V to 11 V, and Vdcp from 0 V to 4.5 V. As a result, the potentials of Vch1 and Vch2 are risen to 7 V and the potential of Vch2 is risen to a level higher than 10 V. In this state, electrons are injected into a selected memory cell, and a non-selected cell is inhibited from writing.

In the above embodiments, Vdcp lower than Vpass is applied to control gate electrodes of the adjacent memory cells on both sides of the selected memory cell. However, the present invention is not limited to these embodiments. The effect of the present invention can be obtained by applying to the control gate electrodes of the two adjacent memory cells a voltage which allows the local self-boosting system for partially self-boosting a channel region of the memory cell column. For example, it is possible that Vdcp is applied to one of the adjacent memory cell and Vpass to the other. However, since the potential of the channel of a cell storing data "1", to which Vpgm is applied through the control gate electrode thereof, is self-boosted higher than the potentials of the other channel regions, it is preferable that the Vdcp be applied to and turn off the gate electrodes of both the adjacent cells.

According to the first aspect of present invention, it is possible to adopt the following modifications:

The voltage Vdcp may be equal to a voltage applied to control gate electrodes of all memory cells other than the selected memory cell in the selected NAND memory cell column when data is read out. This voltage can turn on either of the memory cell in a normally-on state or the memory cell in a normally-off state, and the potential of 0 V of the selected bit line can be transmitted to the channel region of the selected memory cell successfully in the writing operation.

The voltage Vdcp may be equal to a power supply voltage. In this case, there is a merit that a new voltage generation is not required for the voltage Vdcp.

Note that, in the case where one of the adjacent memory cells on both sides of the selected memory cell is the selection transistors S1, the voltage applied to the gate of the other adjacent memory cell may be 0 V, 4.5 V(=Vdcp), or a positive level which is lower than Vdcp, because it is not necessary to supply 0 V to the selected memory cell through the adjacent memory cell on a side of the selected NAND memory cell column. In the case where one of the adjacent memory cells on both sides of the selected memory cell is the selection transistors S2, the voltage applied to the gate of the other adjacent memory cell may be Vdcp that turns on this memory cell.

[Embodiments based on a second aspect of the present invention]

Sixth and seventh embodiments based on a second aspect of the present invention will now be described. In the following, an erasing process technique in a NAND EEPROM will be mainly described.

Figure 26:
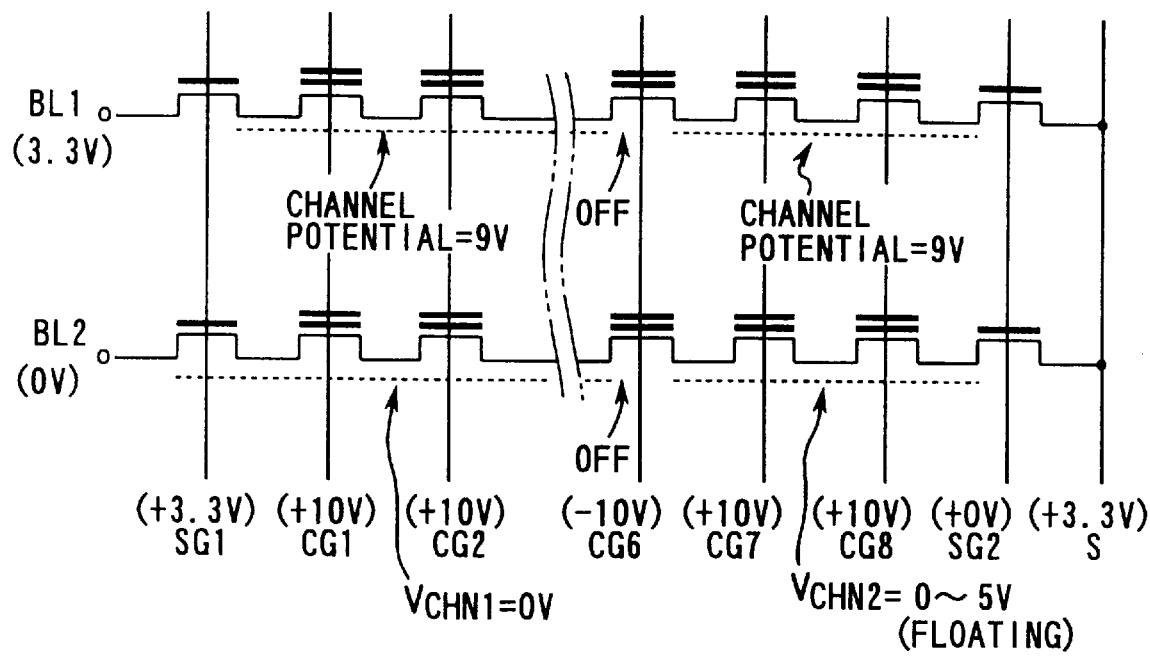
FIG. 26 is a diagram showing voltage control in an erasing operation according to a sixth embodiment of the present invention.
Figure 27:
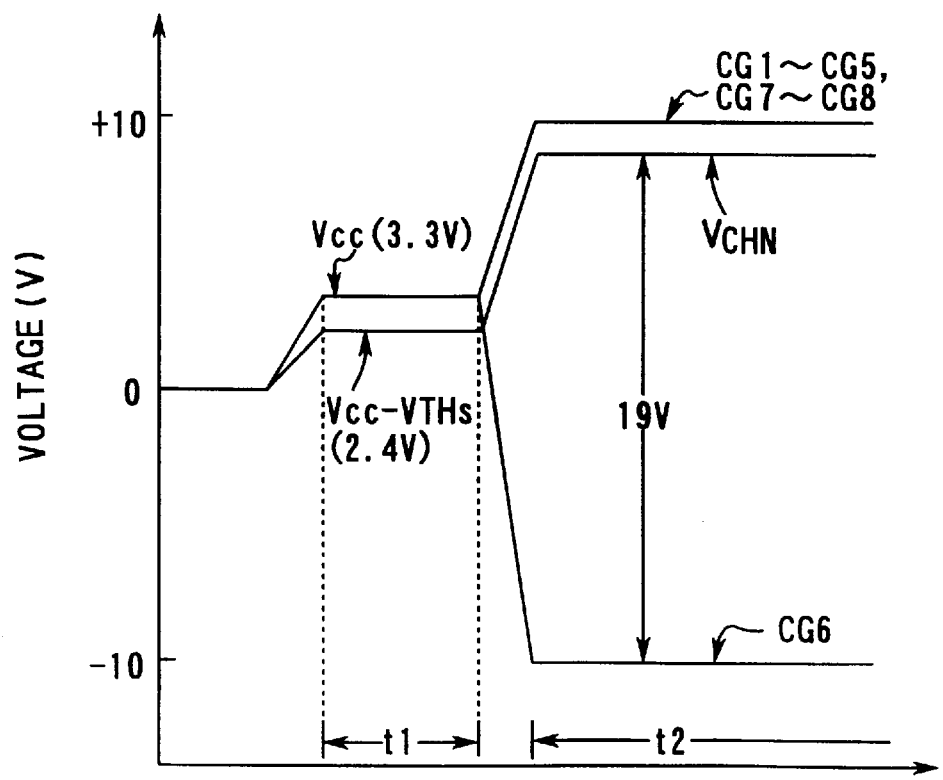
FIG. 27 is a diagram for explaining an erasing operation in a selected NAND cell column and an erase inhibiting operation in another NAND cell column according to the sixth embodiment of the present invention.
Figure 28:
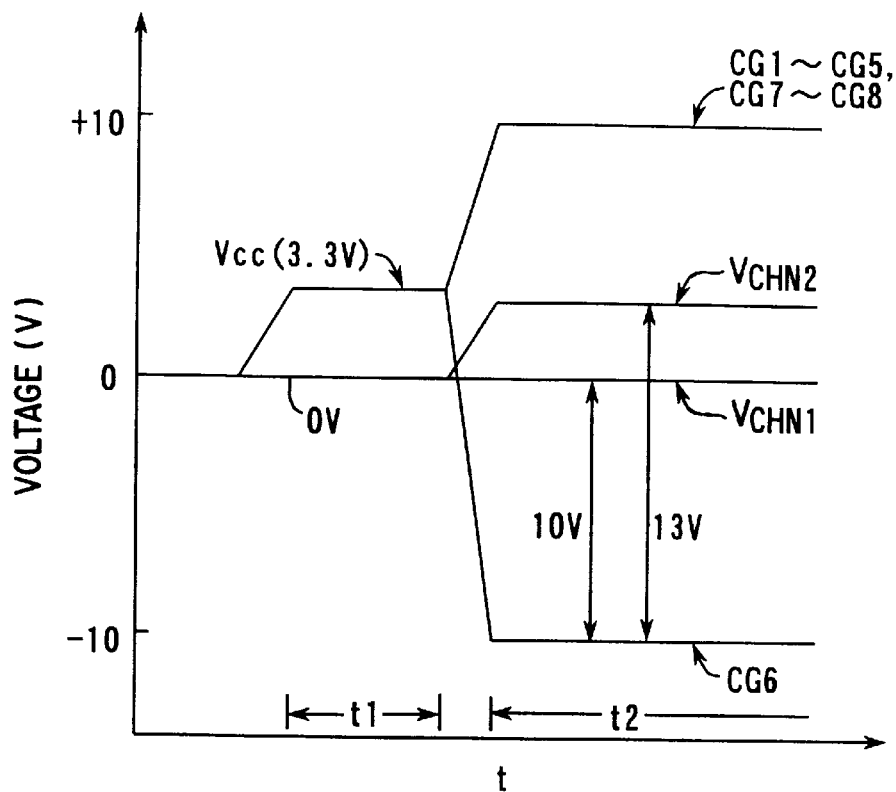
FIG. 28 is a diagram for explaining an erasure inhibiting operation in another NAND cell column according to the sixth embodiment of the present invention.

FIGS. 26, 27 and 28 are diagrams showing voltage control in a NAND EEPROM according to the sixth embodiment of the present invention. A plan view, an equivalent circuit diagram, and longitudinal and lateral cross-sectional views of this embodiment are the same as those shown in FIGS. 1A, 1B, 2 and 3.

As shown in FIG. 26, a voltage of 3.3 V is applied to a bit line BL1 connected to a selected NAND cell column including a selected cell from which data is to be erased. A voltage of 0 V is applied to a bit line BL2 connected to a non-selected cell column.

A data erasing operation in the selected cell and a data holding operation in a non-selected cell in the NAND cell column connected to the bit line BL1 will be described first. As shown in FIG. 27, in a period t1, a selection gate SG1 and control gates CG1 to CG8 are precharged to Vcc (e.g., 3.3 V). A voltage of 0 V is applied to a selection gate SG2 to turn off the selection transistor S2. At this time, the potential $V_{CHN}$ of the channel portion is equal to Vcc−Vths (Vths is a threshold voltage of the selected transistor, about 1 V), i.e., 3.3−1=2.3 V. Since the selection gate SG2 is off, the channel portion is floating.

Subsequently, in a period t2, a voltage of −10 V is applied to a control gate CG6 of a selected cell and a voltage of +10 V is applied to control gates G1 to G5, G7 and G8 of non-selected cells. At this time, the selected cell to which an erasing voltage −10 V is applied through the control gate thereof is turned off. However, Both of the channel regions on the source side and the drain side from the selected cell are floating, the two channel regions are self-boosted to about 9 V by the voltage of 10 V applied to the control gate of the non-selected cell. The self-boosting has been described in detail before and the explanation is not repeated. Note that it is not always necessary that the channel region on the drain side from the selected cell are floating. For example, the voltage to be applied to the selected gate SG1 may be 4.5 V.

In the selected cell, since the potential of the control gate is −10 V and at least one of the potentials of the source and drain is +9 V, a voltage of 19 V, which is high enough to cause a tunnel current to flow between the floating gate electrode and the source/drain, is applied between the gate and the source/drain. Therefore, the electrons are discharged from the floating gate electrode as a tunnel current. As a result, the threshold voltage of the selected memory cell becomes negative (e.g., −2 V), the memory cell is turned to a normally-on state and data is erased therefrom.

In the non-selected cell, since the potential of the control gate is +10 V and the potential of the channel is +9 V, the potential difference between the gate and the substrate is only +1 V. Therefore, no tunnel current flows therebetween and the threshold voltage of the memory cell is maintained to an initial level.

It will now be described how data is held in another NAND cell column having a control gate electrode shared with the aforementioned NAND cell column.

When the bit line BL2 is set to 0 V, the selection gate SG1 is set to Vcc=3.3 V, and all the control gates are set to 3.3 V as shown in FIG. 26, the potentials of all the channel regions are 0 V in a period t1 in FIG. 28. In a period t2 in FIG. 28, an erasing voltage −10 V is applied to the control gate CG6 and a voltage of +10 V is applied to the other control gates CG1 to CG5, CG7 and CG8. As a result, in the same manner as in the selected NAND cell column, the cell transistor which the erasing voltage is applied to its control gate electrode is turned off. Accordingly, as shown in FIG. 26, the channel region is divided into a channel region 1 (represented by the potential $V_{CHN1}$) and a channel region 2 (represented by the potential $V_{CHN2}$) between the control gate CG6 and the selection gate SG2. Since the selection gate SG1 is on, the channel region 1 on the drain side is connected to the bit line BL2 and the potential $V_{CHN1}$ is kept at 0 V, as shown in FIG. 28. In the channel region 2 on the source side, since the selection gate SG2 shown in FIG. 26 is off, the potential $V_{CHN2}$ is floating. For this reason, when the potential of the control gate electrode of the non-selected cell becomes +10 V, the potential $V_{CHN2}$ of the channel region 2 is boosted to 0–5 V (e.g., 3 V). As a result, in this NAND cell column, the potential difference between the control gate and the channel in each of CG1 to CG5 is 10 V, while the potential difference between the control gate and the channel in each of the control gates CG7 and CG8 is 7 V. With this potential difference, a tunnel current does not flow between a charge storage layer and the substrate within an ordinary erasure time. As regards a cell transistor in which the channel is off, a tunnel current can flow through a path between the floating gate and a source or drain region. However, since the potential difference in the path is 10 V or 3 V, the tunnel current cannot flow, so long as an ordinary erasure time is employed. Therefore, data erasing is not carried out in the NAND cell column.

As described above, according to this embodiment, the voltage of −10 V is applied to the control gate of the selected cell from which data is to be erased, and the source and drain of the cell is boosted to 9 V by means of the self-boosting system of K. D. Suh et al. As a result, a voltage high enough for data erasing is applied to the control gate between the electrode and the source/drain of the selected cell. Since voltages of the opposite polarities are applied to the control gate and the channel region of the NAND cell column, the absolute value of each voltage can be about half that in the case where one of the voltages is 0 V. For example, see the description of the flush erasure in the prior art, in which a high voltage of 20 V must be applied to the p-well layer, since the control gate is set to 0 V. According to this embodiment, in order to reduce the absolute value of the erasure voltage, it is unnecessary to constitute a NAND EEPROM by transistors of a high withstand voltage as required in the conventional art. In addition, the design rule of the wiring can be the same as that in the ordinary case of using a low voltage, the integration density of the elements can be increased and the chip size can be reduced. Moreover, since it is unnecessary to use a high voltage, the reliability of the device is improved.

The above description relates to bit erasure in which data is erased from a cell selected one by one. However, if bit lines BL, connected to a predetermined number of NAND cell columns which share control gate electrodes, are all set to 3.3 V, the cells connected to a selected control gate in all the NAND cell columns can be erased at once. Thus, page erasure for erasing all the data on a page can be executed.

Figure 29:
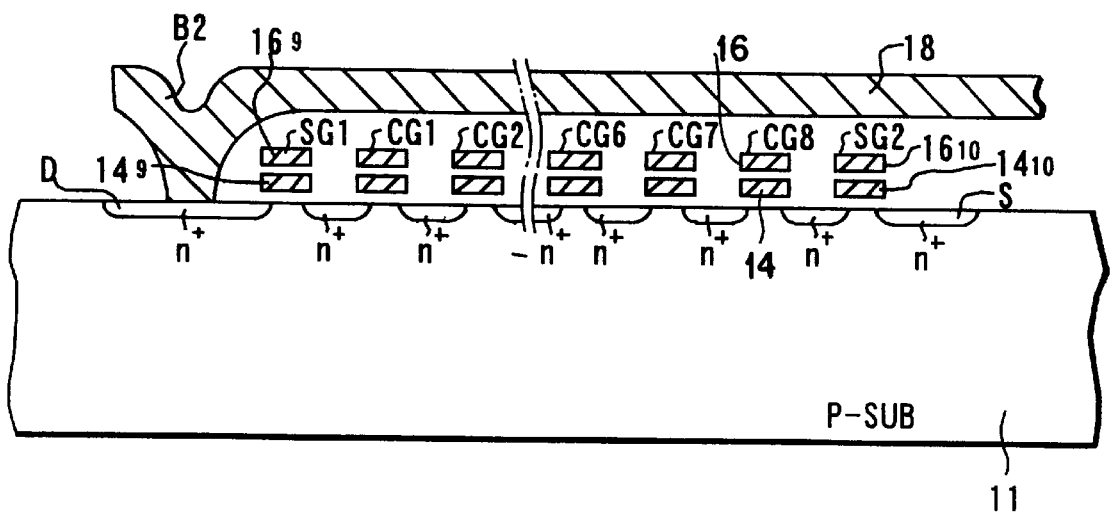
FIG. 29 is a cross-sectional view of a NAND EEPROM memory cell column according to a sixth embodiment of the present invention.

A seventh embodiment of the present invention will now be described with reference to FIG. 29. In this embodiment, no n-well layer or p-well layer is formed, and a memory cell portion is formed directly on a p-type substrate. The timing of voltage control in an erasure operation is the same as that in the sixth embodiment.

According to the seventh embodiment, since the potential of the p-type substrate can be 0 V, a NAND memory cell array can be formed in the p-type substrate region like an n-channel transistor of a peripheral MOS circuit. Therefore, it is unnecessary to form an n-well or p-well to form a memory cell portion as required in the NAND EEPROM shown in FIG. 2, so that the manufacturing process can be simplified.

As has been described above, according to the first aspect of the present invention, in a NAND cell column connected to a non-selected bit line, since the channel potential of a memory cell, to which a high writing voltage is applied through the control gate electrode thereof, is sufficiently self-boosted, the stress on the cell can be reduced. Further, even after data is written into a desired memory cell in a NAND cell column, data can be written at random. Furthermore, the reliability of the elements can be improved without lowering the device performance.

According to the second aspect of the present invention, since it is unnecessary to use a high voltage as required in the conventional art in an erase operation, the number of stages of the booster circuit can be reduced. Further, since transistors need not be of a high-withstand voltage type, the area occupied by peripheral circuits can be reduced. In addition, since data erasure can be achieved at a low voltage, the reliability of elements can be improved and an increase in the yield can be expected.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A voltage control method for a writing process in a non-volatile semiconductor memory device including a plurality of NAND strings, each having a plurality of electrically erasable programmable memory cells connected in series, and a selection gate transistor connected to an end on a bit line side of the NAND string, the method comprising the steps of:

applying a first predetermined voltage from a first bit line to a selected NAND string, and applying a program inhibit voltage from a second bit line to a non-selected NAND string which shares control gate electrodes with the selected NAND string;

setting a gate voltage of the selection gate transistor to a predetermined potential; and shifting a control gate voltage of a selected memory cell in the selected NAND string to a first potential, shifting a control gate voltage of at least one of the memory cells adjacent to the selected memory cell and located on both sides of the selected memory cell to a second potential, and shifting a control gate voltage of each memory cell in the selected NAND string, other than the selected memory cell and the adjacent memory cells located on both sides of the selected memory cell, to a third potential, wherein the first potential is greater than third potential which is greater than second potential which is greater than 0.

2. The method according to claim 1, wherein a control gate voltage of each of the adjacent memory cells located on both sides of the selected memory cell is set to the second potential.

3. The method according to claim 1, wherein the second potential is equal to a power supply voltage.

4. A voltage control method for a writing process in a non-volatile semiconductor memory device including a plurality of NAND strings, each having a plurality of electrically erasable programmable memory cells connected in series, and a selection gate transistor connected to an end on a bit line side of the NAND string, the method comprising the steps of:

applying a first predetermined voltage from a first bit line to a selected NAND string, and applying a program inhibit voltage from a second bit line to a non-selected NAND string which shares control gate electrodes with the selected NAND string;

setting a gate voltage of the selection gate transistor to a predetermined potential; and raising a control gate voltage of a selected memory cell in the selected NAND string to a first potential, raising a control gate voltage of at least one memory cells adjacent to the selected memory cell and located on both sides of the selected memory cell to a second potential, and raising a control gate voltage of each of the memory cells in the selected NAND string, other than the selected memory cell and the adjacent memory cells located on both sides of the selected memory cell, to a third potential, wherein the first potential is greater than the third potential which is greater than the second potential which is greater than the predetermined potential.

5. The method according to claim 4, wherein a control gate voltage of each of the adjacent memory cells located on both sides of the selected memory cell is set to the second potential.

6. The method according to claim 4, wherein the second potential is equal to a power supply voltage.

7. A voltage control method for a writing process in a non-volatile semiconductor memory device including a plurality of NAND strings, each having a plurality of electrically erasable programmable memory cells connected in series, and a selection gate transistor connected to an end on a bit line side of the NAND string, the method comprising the steps of:

applying a first predetermined voltage from a first bit line to a selected NAND string, and applying a program inhibit voltage from a second bit line to a non-selected NAND string which shares control gate electrodes with the selected NAND string;

setting a gate voltage of the selection gate transistor to a predetermined potential;

raising a control gate voltage of a selected memory cell in the selected NAND string, a control gate voltage of at least one of the memory cells adjacent to the selected memory cell and located on both sides of the selected memory cell, and a control gate voltage of each of the memory cells in the selected NAND string, other than the selected memory cell and the adjacent memory cells located on both sides of the selected memory cell, to a common potential which is greater than the predetermined voltage; and raising the control gate voltage of the selected memory cell from the common potential to a first potential, holding the control gate voltage of at least one of the adjacent memory cells located on both sides of the selected memory cell at the common potential as a second potential, and raising the control gate voltage of each of the memory cells in the selected NAND string, other than the selected memory cell and the adjacent memory cells located on both sides of the selected memory cell, from the common potential to a third potential, wherein the first potential is greater than the third potential, which is greater than the second potential, which is greater than the predetermined potential.

8. The method according to claim 7, wherein a control gate voltage of each of the adjacent memory cells located on both sides of the selected memory cell is set to the second potential.

9. The method according to claim 7, wherein the second potential is equal to a power supply voltage.

10. A voltage control method for a writing process in a non-volatile semiconductor memory device including a plurality of NAND strings, each having a plurality of electrically erasable programmable memory cells connected in series, and a selection gate transistor connected to an end on a bit line side of the NAND string, the method comprising the steps of:

applying a first predetermined voltage from a first bit line to a selected NAND string, and applying a program inhibit voltage from a second bit line to a non-selected NAND string which shares control gate electrodes with the selected NAND string;

setting a gate voltage of the selection gate transistor to a predetermined potential;

raising a control gate voltage of a selected memory cell in the selected NAND string, a control gate voltage of at least one of the memory cells adjacent to the selected memory cell and located on both sides of the selected memory cell, and a control gate voltage of each of the memory cells in the selected NAND string, other than the selected memory cell and the adjacent memory cells located on both sides of the selected memory cell, to a common potential which is greater than the predetermined voltage; and raising the control gate voltage of the selected memory cell from the common potential to a first potential, lowering the control gate voltage of at least one of the adjacent memory cells located on both sides of the selected memory cell from the common potential to a second potential, and holding the control gate voltage of each of the memory cells in the selected NAND string, other than the selected memory cell and the adjacent memory cells located on both sides of the selected memory cell, at the common potential as a third potential, wherein the first potential is greater than the third potential, which is greater than the second potential, which is greater than the predetermined potential.

11. The method according to claim 10, wherein a control gate voltage of each of the adjacent memory cells located on both sides of the selected memory cell is set to the second potential.

12. The method according to claim 10, wherein the second potential is equal to a power supply voltage.

13. A voltage control method for a writing process in a non-volatile semiconductor memory device including a plurality of NAND strings, each having a plurality of electrically erasable programmable memory cells connected in series, and a selection gate transistor connected to an end on a bit line side of the NAND string, the method comprising the steps of:

applying a first predetermined voltage from a first bit line to a selected NAND string, and applying a program inhibit voltage from a second bit line to a non-selected NAND string which shares control gate electrodes with the selected NAND string;

setting a gate voltage of the selection gate transistor to a predetermined potential;

raising a control gate voltage of a selected memory cell in the selected NAND string to a first potential, raising a control gate voltage of at least one of the memory cells adjacent to the selected memory cell and located on both sides of the selected memory cell to a second potential which is equal to the predetermined potential, and raising a control gate voltage of each of the memory cells in the selected NAND string, other than the selected memory cell and the adjacent memory cells located on both sides of the selected memory cell, to a third potential, wherein the first potential is greater than the third potential, which is greater than the second potential; and lowering the gate voltage of the selection gate transistor to a voltage which is lower than the predetermined potential.

14. The method according to claim 13, wherein a control gate voltage of each of the adjacent memory cells located on both sides of the selected memory cell is set to the second potential.

15. The method according to claim 13, wherein the second potential is equal to a power supply voltage.

16. A voltage control method for a writing process in a non-volatile semiconductor memory device including a plurality of NAND strings, each having a plurality of electrically erasable programmable memory cells connected in series, and a selection gate transistor connected to an end on a bit line side of the NAND string, the method comprising the steps of:

applying a first predetermined voltage from a first bit line to a selected NAND string, and applying a program inhibit voltage from a second bit line to a non-selected NAND string which shares control gate electrodes with the selected NAND string;

setting gate voltage of the selection gate transistor to a predetermined potential;

lowering the gate voltage of the selection gate transistor to a voltage which is lower than the predetermined potential; and raising a control gate voltage of a selected memory cell in the selected NAND string to a first potential, raising a control gate voltage of at least one of the memory cells adjacent to the selected memory cell and located on both sides of the selected memory cell to a second potential which is equal to the predetermined potential, and raising a control gate voltage of each of the memory cells in the selected NAND string, other than the selected memory cell and the adjacent memory cells located on both sides of the selected memory cell, to a third potential, wherein the first potential is greater than the third potential, which is greater than the second potential.

17. The method according to claim 16, wherein a control gate voltage of each of the adjacent memory cells located on both sides of the selected memory cell is set to the second potential.

18. The method according to claim 16, wherein the second potential is equal to a power supply voltage.

19. A voltage control method for an erasing process in a non-volatile semiconductor memory device including a plurality of NAND strings, each having a plurality of electrically erasable programmable memory cells connected in series, a first selection gate transistor connected to a first end on a bit line side of the NAND string, and a second selection gate transistor connected to a second end on a source line side of the NAND string, the method comprising the steps of:

applying a program inhibit voltage from a first bit line to a selected NAND string, and applying a first predetermined voltage from a second bit line to a non-selected NAND string which shares control gate electrodes with the selected NAND string;

raising a gate voltage of the selection gate transistor, a control gate voltage of a selected memory cell in the selected NAND string, and a control gate voltage of a non-selected memory cell to a common potential; and lowering the control gate voltage of the selected memory cell from the common potential to a first potential, and raising the control gate voltage of the non-selected memory cell to a second potential, a polarity of the first potential being different from a polarity of the second potential, wherein at least a channel region of a memory cell between the selected memory cell and the second selection gate is raised to a potential high enough to cause a tunnel current in the selected memory cell.

20. The method according to claim 19, wherein channel regions of memory cells in the non-selected NAND string are set to potentials lower than a potential high enough to cause tunnel currents in the memory cells therein.

21. The method according to claim 19, wherein each of the common potential and the second potential is a positive potential, and the first potential is a negative potential.

* * * * *